United States Patent [19]
Fujii et al.

[11] Patent Number: 6,111,427
[45] Date of Patent: Aug. 29, 2000

[54] LOGIC CIRCUIT HAVING DIFFERENT THRESHOLD VOLTAGE TRANSISTORS AND ITS FABRICATION METHOD

[75] Inventors: Koji Fujii, Zama; Takakuni Douseki, Atsugi, both of Japan

[73] Assignee: Nippon Telegraph and Telephone Corporation, Toyko, Japan

[21] Appl. No.: 08/861,319

[22] Filed: May 21, 1997

[30] Foreign Application Priority Data

May 22, 1996 [JP] Japan ..................................... 8-150268
Aug. 13, 1996 [JP] Japan ..................................... 8-231306

[51] Int. Cl.⁷ .................................................. H03K 17/16
[52] U.S. Cl. ................................ 326/34; 326/83; 326/121
[58] Field of Search ........................... 326/17, 31, 34–36, 326/53, 54, 55, 83, 86, 112, 119, 121

[56] References Cited

U.S. PATENT DOCUMENTS

| | | | |
|---|---|---|---|
| 4,107,548 | 8/1978 | Sakaba et al. | 326/119 |
| 4,441,039 | 4/1984 | Schuster | 326/86 |
| 4,473,762 | 9/1984 | Iwahashi et al. | 327/262 |
| 4,563,599 | 1/1986 | Donoghue et al. | 326/120 |
| 4,714,840 | 12/1987 | Proebsting | 326/34 |
| 5,486,774 | 1/1996 | Douseki et al. | 326/81 |
| 5,594,371 | 1/1997 | Douseki | 326/119 |
| 5,610,533 | 3/1997 | Arimoto et al. | 326/33 |
| 5,821,769 | 10/1998 | Douseki | 326/34 |

FOREIGN PATENT DOCUMENTS

| | | |
|---|---|---|
| 0690510 A1 | 1/1996 | European Pat. Off. . |
| 4-263468 | 9/1992 | Japan . |
| 08287686 | 11/1996 | Japan . |

OTHER PUBLICATIONS

ISSCC96/Session 5/Technology Directions: High Speed, Low Power/Paper TP 5. TP:5.4 A 0.5V Simox–MTCMOS Circuit with 200ps Logic Gate; Takakuni Douseki, et al., 1996 IEEE International Solid–State Circuits Conference; pp. 84–85, 66–67, and 364–365.

*Primary Examiner*—Jon Santamauro
*Assistant Examiner*—Don Phu Le
*Attorney, Agent, or Firm*—Venable; Robert J. Frank; Jeffrey W. Gluck

[57] ABSTRACT

A logic circuit having a first logic gate and the remaining logic gate or gates. The first logic gate is interposed in a signal path determining an operating speed, and includes at least one first MOS transistor which has a threshold voltage lower than a predetermined voltage and operates at a high speed. The remaining logic gate or gates include at least one of a second MOS transistor and a third MOS transistor as a transistor having a margin for operating speed. The second MOS transistor has a middle threshold voltage equal to or greater than the predetermined voltage, and the third MOS transistor has a high threshold voltage equal to or greater than the predetermined voltage. The power consumption of the entire logic circuit at the time of operation is reduced, while maintaining the maximum operating speed.

17 Claims, 24 Drawing Sheets

| | LOW THRESHOLD VOLTAGE MOS TRANSISTOR | MIDDLE THRESHOLD VOLTAGE MOS TRANSISTOR | HIGH THRESHOLD VOLTAGE MOS TRANSISTOR |
|---|---|---|---|
| nMOS | | | |
| pMOS | | | |

FIG.5

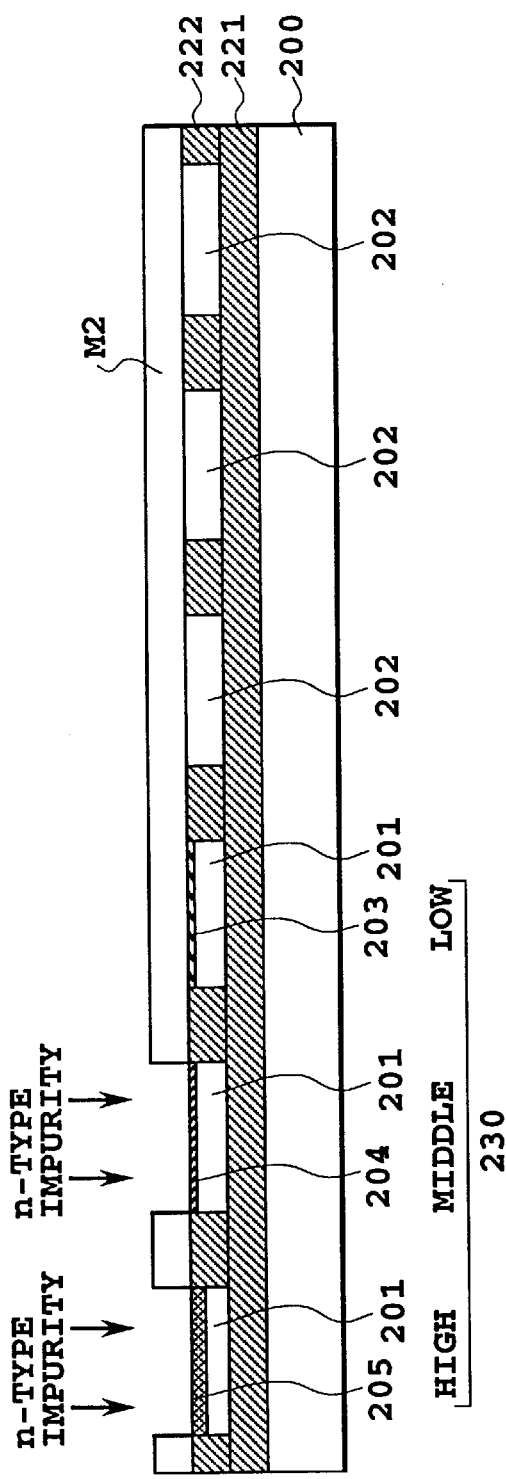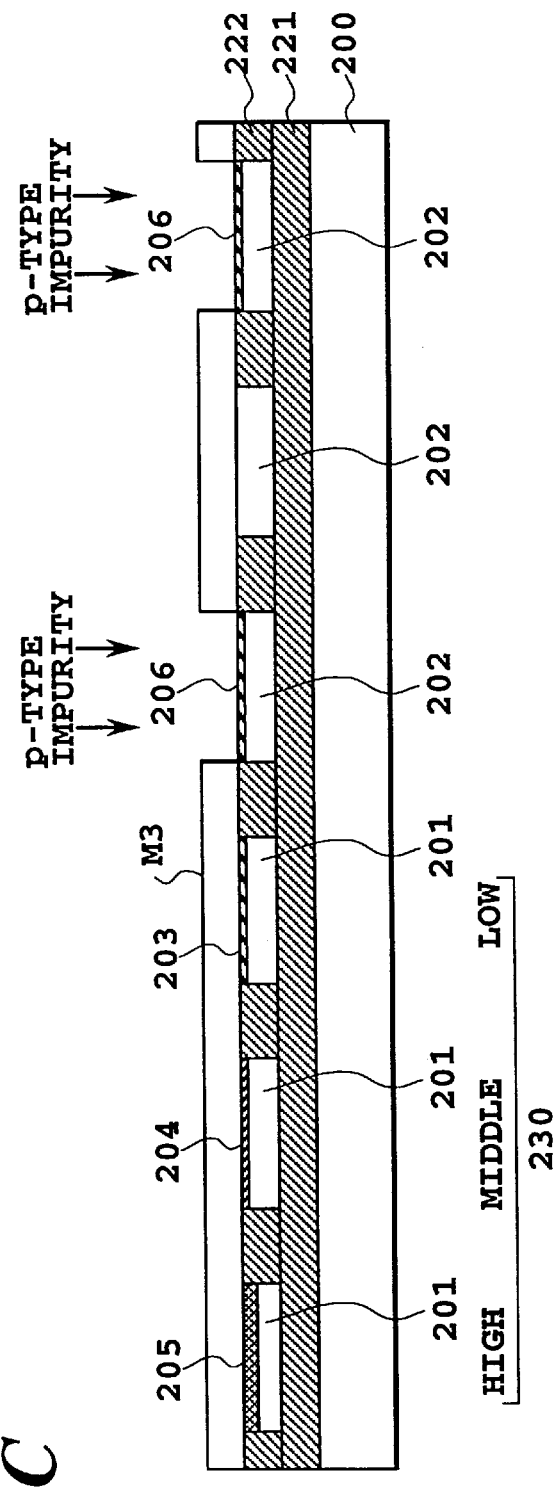
FIG.9C
FIG.9D

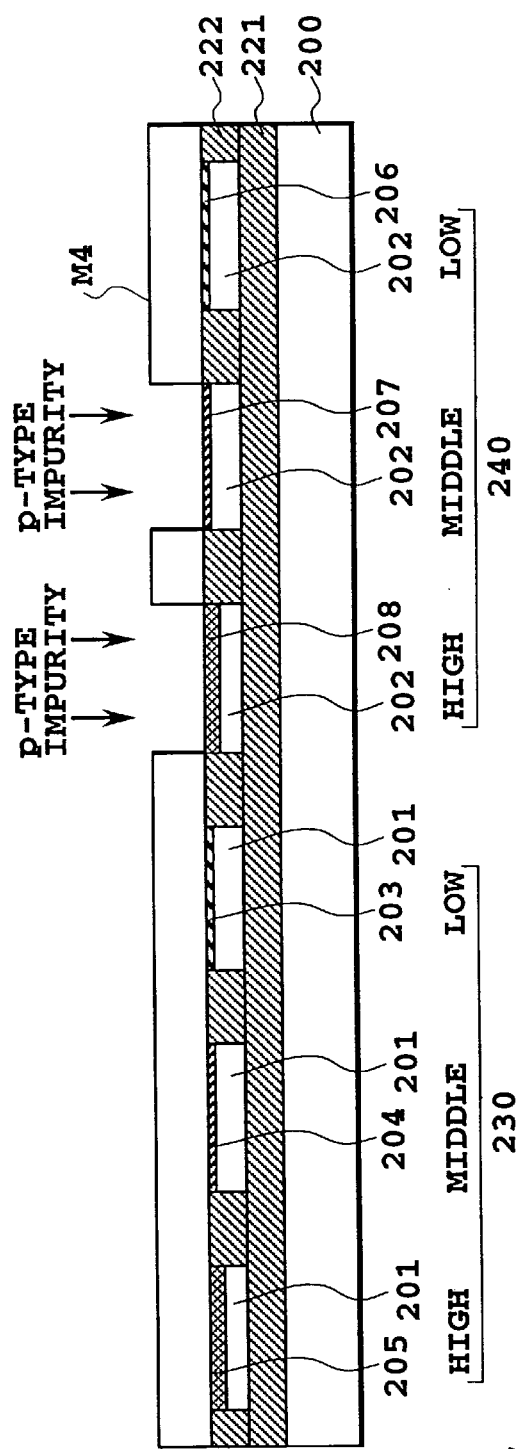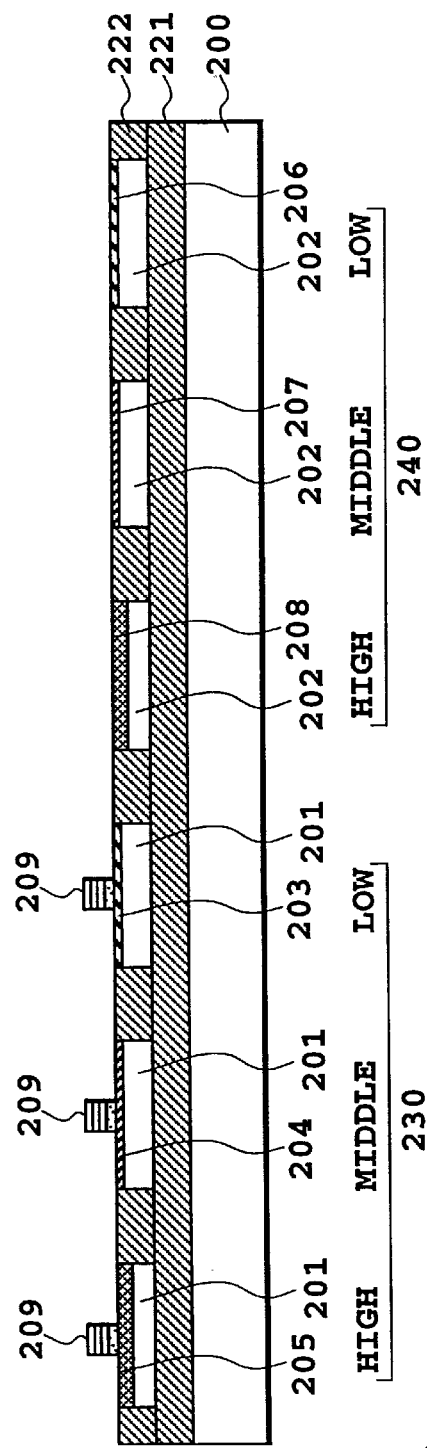
FIG.9E
FIG.9F

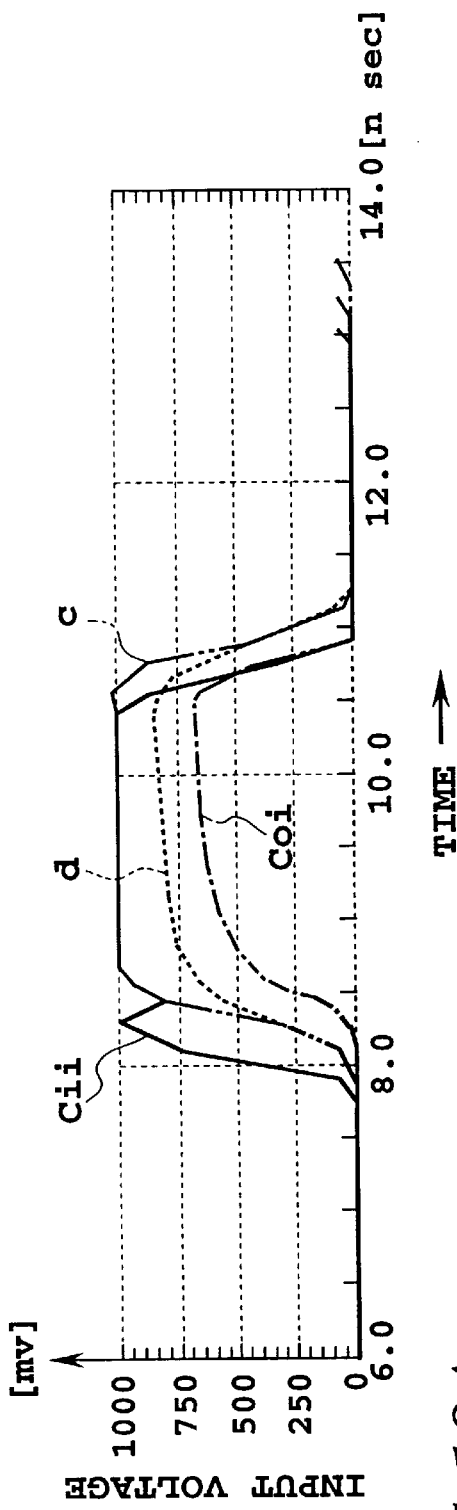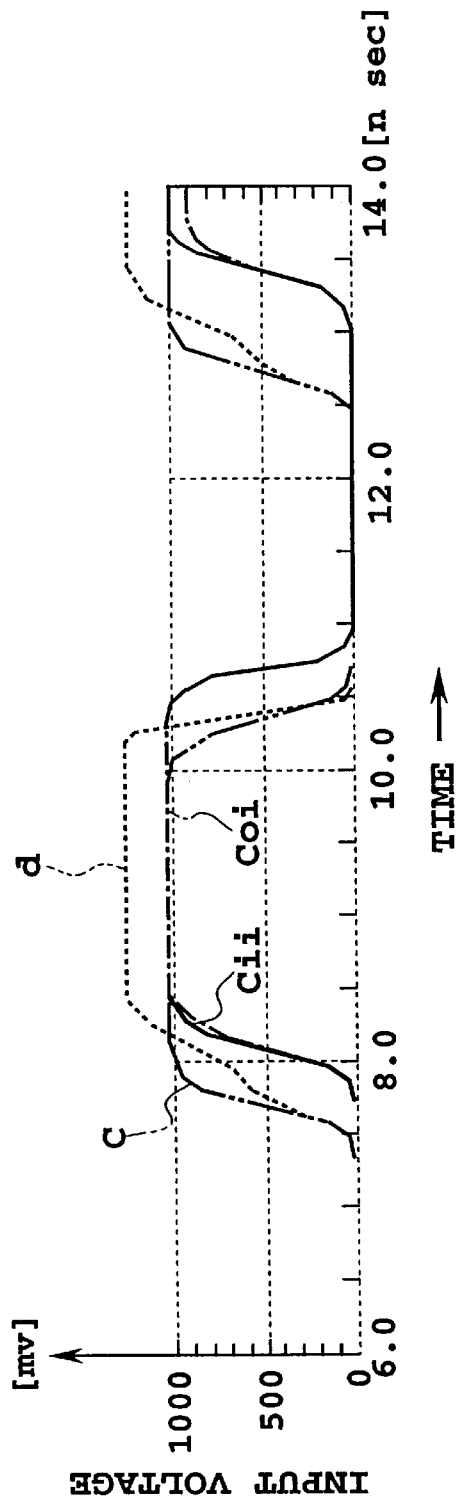
FIG.18A
FIG.18B

LOGIC CIRCUIT HAVING DIFFERENT THRESHOLD VOLTAGE TRANSISTORS AND ITS FABRICATION METHOD

BACKGROUND OF THE INVENTION

1. Field of the Invention

The present invention relates to a logic circuit and its fabrication method, and more particularly to a circuit structure for implementing a low power consumption CMOS logic circuit.

2. Description of Related Art

A CMOS circuit structure is widely employed in fields such as mobile telecommunication systems that consist of low power consumption LSIs with a supply voltage of one volts or less.

FIG. 22 is a circuit diagram showing a conventional CMOS logic circuit. In FIG. 22, a CMOS logic circuit C11 is composed of a high threshold voltage pMOS transistor 81, a low threshold voltage pMOS transistor 82, and a low threshold voltage NMOS transistor 83. In other words, the CMOS logic circuit C11 is composed of MOS transistors with the high threshold voltage and low threshold voltage.

The conventional CMOS logic circuit C11 has a high operating speed because it uses low threshold voltage MOS transistors 82 and 83. In addition, smaller leakage current flows through the low threshold voltage MOS transistors 82 and 83 in a sleeping mode than in an operating mode, since the pMOS transistor 81 is kept OFF. This can reduce power consumed by the low threshold voltage MOS transistors 82 and 83 in the sleep mode.

In the CMOS logic circuit C11, however, a leakage current flows through the MOS transistors 82 and 83, since the pMOS transistor 81 is turned on in the operation mode, and the leakage current causes power loss. Thus, the conventional CMOS logic circuit C11 has a problem in that it cannot prevent a power loss in an operation mode.

SUMMARY OF THE INVENTION

It is, therefore, an object of the present invention to provide a logic circuit capable of reducing the power consumption in the operation mode, while maintaining a high operating speed like the conventional circuit.

It is another object of the present invention to provide a fabrication method for the logic circuit without increasing the process steps.

In a first aspect of the present invention, there is provided a logic circuit comprising:

a first logic gate having at least one first MOS transistor and interposed in a signal path determining an operating speed, the first MOS transistor having a threshold voltage lower than a predetermined voltage and operating at a high speed; and one or plural remaining logic gates other than the first logic gate having at least one of a second MOS transistor and a third MOS transistor as a transistor having a margin for operating speed, the second MOS transistor having a medium threshold voltage equal to or greater than the predetermined voltage, and the third MOS transistor having a high threshold voltage equal to or greater than the predetermined voltage.

The logic circuit may further comprise a fourth MOS transistor having a high threshold voltage interposed between a main power supply line and a terminal of at least one of the first and second MOS transistors on the side of a high potential power supply line.

At least one first MOS transistor in the first logic gate may include a fifth MOS transistor constituting a transfer gate interposed in the signal path, and a sixth MOS transistor for controlling the fifth MOS transistor, and the one or plural remaining logic gates may include a second logic gate for determining an output of the fifth MOS transistor, and a third logic gate for controlling the sixth MOS transistor.

The sixth MOS transistor may have its drain terminal connected to a gate terminal of the fifth MOS transistor, its source terminal connected to an output terminal of the third logic gate, and its gate terminal connected to one of the high potential power supply line and the main power supply line, or the ground.

The first, second and third MOS transistors may have a SOI structure, and at least one of the low threshold voltage first MOS transistor and the medium threshold voltage second MOS transistor may be a fully depleted MOS transistor.

The MOS transistors may have a SOI structure, at least one of the low threshold voltage first MOS transistor and the medium threshold voltage second MOS transistor may be a fully depleted MOS transistor, and the high threshold voltage third MOS transistor may be a fully depleted MOS transistor.

The fifth MOS transistor may be a first first-conductivity-type-channel MOS enhancement transistor having a source connected to a signal input terminal of the transfer gate, and a drain connected to a signal output terminal of the transfer gate, the sixth MOS transistor may be a second first-conductivity-type-channel MOS enhancement transistor having a source connected to an output terminal of the third logic gate, a drain connected to a gate of the first first-conductivity-type-channel MOS enhancement transistor, and a gate connected to the high potential power supply or the ground, and a body of the first first-conductivity-type-channel MOS enhancement transistor and a body of the second first-conductivity-type-channel MOS enhancement transistor may both be made floating.

The first first-conductivity-type-channel MOS enhancement transistor and the second first-conductivity-type-channel MOS enhancement transistor may have a SOI structure.

The first first-conductivity-type-channel MOS enhancement transistor and the second first-conductivity-type-channel MOS enhancement transistor may be of the fully depleted type.

One or plural remaining logic gates may include a full adder for performing addition by receiving first and second input signals and a carry signal, the carry signal being supplied to the transfer gate, the third logic gate may control to determine whether or not the carry signal is output from the transfer gate in response to the first and second input signals, and the second logic gate may generate as an output of the transfer gate an output predetermined in accordance with the first and second input signals when the carry signal is not output from the transfer gate in response to the first and second input signals.

At least one first MOS transistor having a lower threshold voltage may include first and second first-conductivity-type-channel enhancement MOS transistors, the first first-conductivity-type-channel enhancement MOS transistor having a source connected to a signal input terminal, and a drain connected to a signal output terminal; and the second first-conductivity-type-channel enhancement MOS transistor having a source connected to a control terminal, a drain connected to a gate of the first first-conductivity-type-channel enhancement MOS transistor, and a gate connected to a high potential power supply or the ground, the first and second first-conductivity-type-channel enhancement MOS transistors, whose bodies are made floating, may constitute a switching circuit as a transfer gate.

In a second aspect of the present invention, there is provided a fabrication method for fabricating a logic circuit including a first logic gate having at least one first MOS transistor and interposed in a signal path determining an operating speed, the first MOS transistor having a threshold voltage lower than a predetermined voltage and operating at a high speed; and one or plural remaining logic gates other than the first logic circuit having at least one of a second MOS transistor and a third MOS transistor as a transistor having a margin for operating speed, the second MOS transistor having a medium threshold voltage equal to or greater than the predetermined voltage, and the third MOS transistor having a high threshold voltage equal to or greater than the predetermined voltage, the fabrication method comprising the steps of:

(A) forming MOS device regions for forming MOS transistors having low, medium and high threshold voltages, the MOS device regions being isolated from each other;

(B) implanting impurity for a low threshold into the MOS device regions for forming the MOS transistors having the low and high threshold voltages; and (C) implanting impurity for a medium threshold into the MOS device regions for forming the MOS transistors having the medium and high threshold voltages.

The step (A) may form in the MOS device regions first and second conductivity type MOS device regions; and the steps (B) and (C) may be carried out in the first conductivity type MOS device regions; and subsequently the steps (B) and (C) may be carried out in the second conductivity type MOS device regions.

In a third aspect of the present invention, there is provided a fabrication method for fabricating a logic circuit including a first logic gate having at least one first MOS transistor and interposed in a signal path determining an operating speed, the first MOS transistor having a threshold voltage lower than a predetermined voltage and operating at a high speed;

one or plural remaining logic gates other than the first logic circuit having at least one of a second MOS transistor and a third MOS transistor as a transistor having a margin for operating speed, the second MOS transistor having a medium threshold voltage equal to or greater than the predetermined voltage, and the third MOS transistor having a high threshold voltage equal to or greater than the predetermined voltage; and a fourth MOS transistor having a high threshold voltage interposed between a main power supply line and a terminal of at least one of the first and second MOS transistors on the side of a high potential power supply line;

the fabrication method comprising the steps of:

(A) forming MOS device regions for forming MOS transistors having low, medium and high threshold voltages, the MOS device regions being isolated from each other;

(B) implanting impurity for a low threshold into the MOS device regions for forming the MOS transistors having the low and high threshold voltages; and (C) implanting impurity for a medium threshold into the MOS device regions for forming the MOS transistors having the middle and high threshold voltages.

The above and other objects, effects, features and advantages of the present invention will become more apparent from the following description of the embodiments thereof taken in conjunction with the accompanying drawings.

BRIEF DESCRIPTION OF THE DRAWINGS

FIG. 5 is an explanatory diagram illustrating symbols of nMOS and pMOS transistors, each having low, medium and high threshold voltages respectively;

FIGS. 9A–9J are cross-sectional views illustrating a specific embodiment of the process steps shown in FIGS. 7A and 7B;

FIGS. 18A and 18B are diagrams plotting voltages at various terminals based on circuit simulation when using high threshold voltage transistors as the MOS transistors of the switching circuit SW;

DETAILED DESCRIPTION OF PREFERRED EMBODIMENTS

The present invention will now be described with reference to the accompanying drawings.

Embodiment 1

Figure 1:
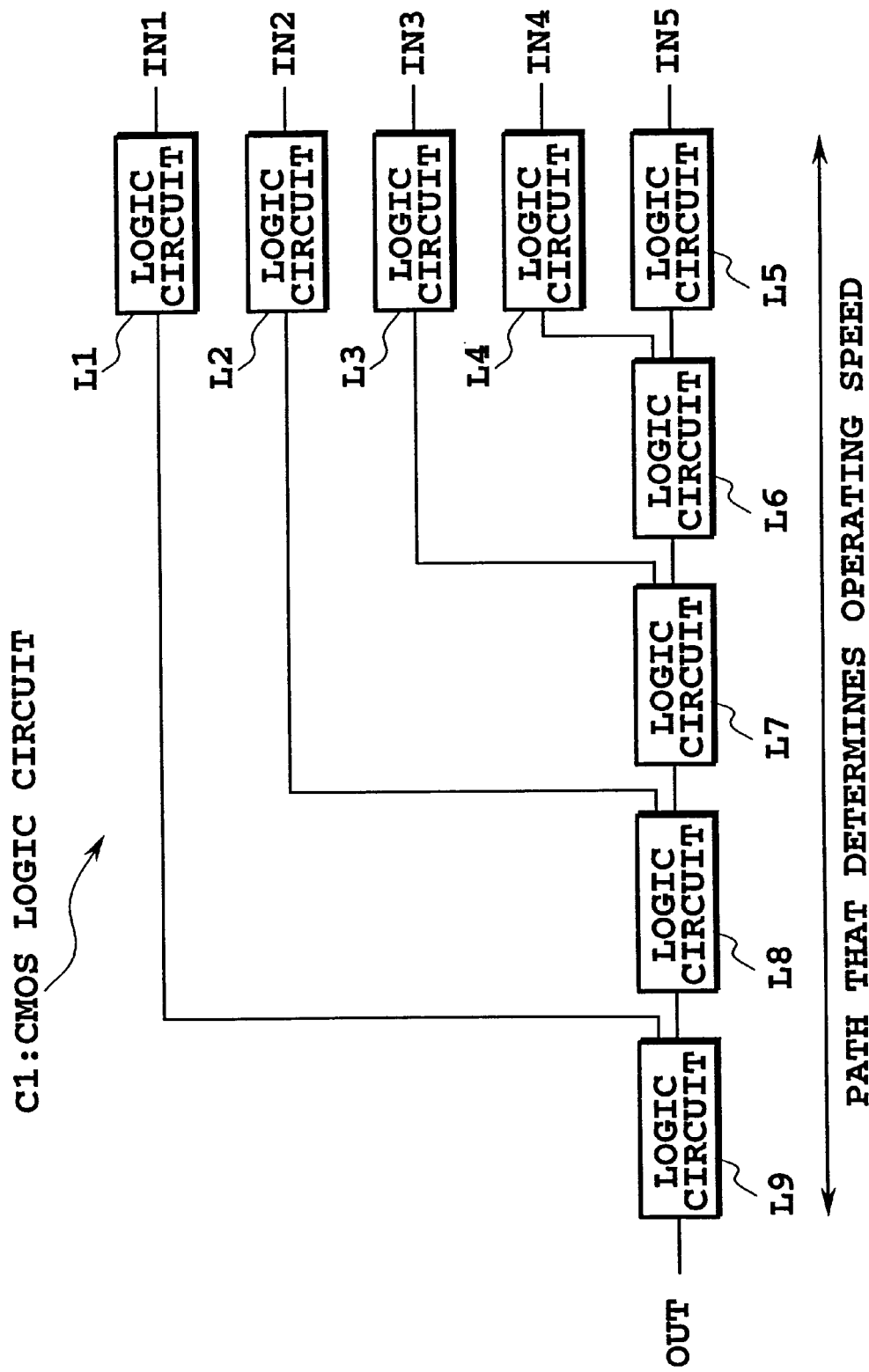
FIG. 1 is a block diagram showing a first embodiment of a logic circuit in accordance with the present invention.

FIG. 1 is a block diagram showing a first embodiment of a logic circuit C1 in accordance with the present invention.

In FIG. 1, a CMOS logic circuit C1 is a combinational logic circuit composed of logic circuits L1–L9. The logic circuits L4–L9 are each composed of logic gates using low threshold voltage MOS transistors, and the operating speed of the CMOS logic circuit C1 is determined by the logic circuits L4–L9.

Figure 2:
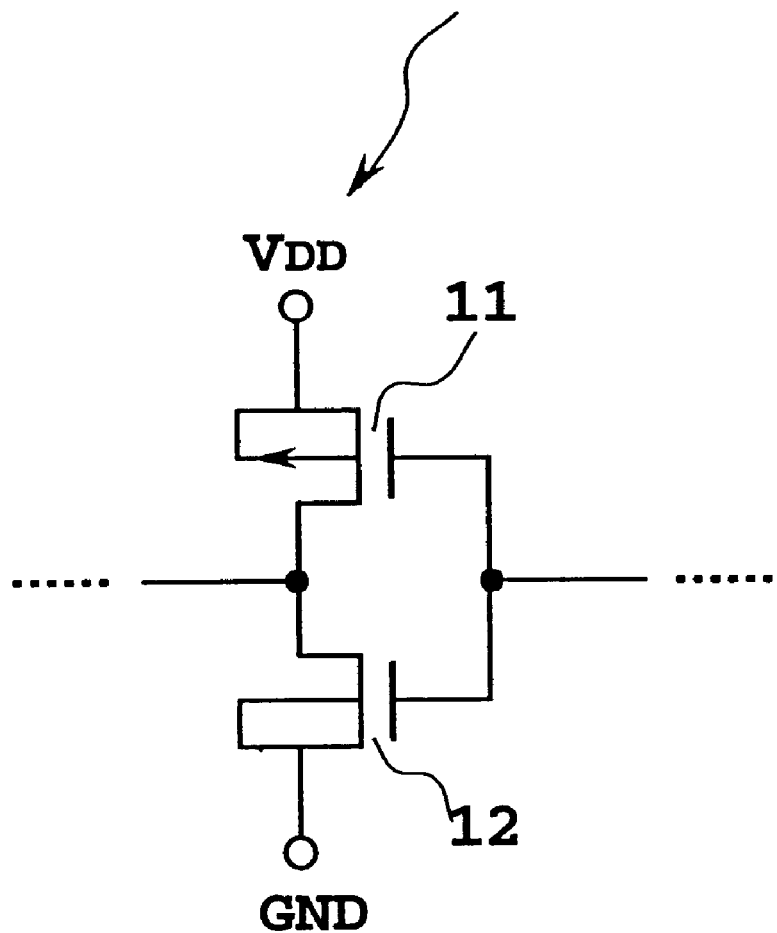
FIG. 2 is a circuit diagram showing a specific embodiment of a logic gate in the logic circuit L1 in FIG. 1.

FIG. 2 is a circuit diagram showing a logic gate in the logic circuit L1 in the CMOS logic circuit C1, which is composed of high threshold voltage MOS transistors 11 and 12.

Figure 3:
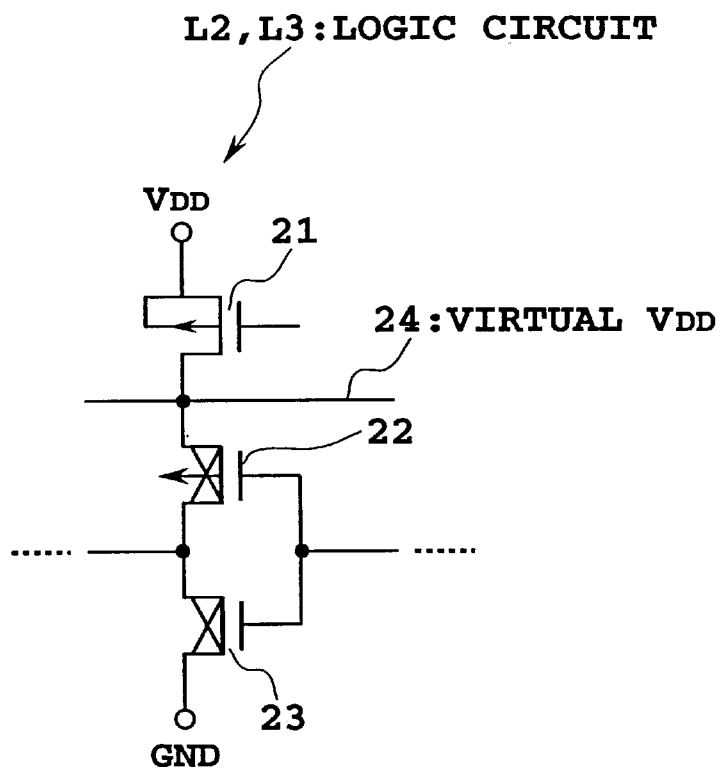
FIG. 3 is a circuit diagram showing a specific embodiment of a logic gate in the logic circuits L2 and L3 in FIG. 1.

FIG. 3 shows a specific embodiment of a logic gate in the logic circuits L2 and L3 in the CMOS logic circuit C1.

The logic gate in the logic circuit L2 includes a series connection of a medium threshold voltage pMOS transistor 22 and a medium threshold voltage nMOS transistor 23. The power supply $V_{DD}$ is connected to a virtual high potential power supply line (Virtual $V_{DD}$) 24 through a high threshold voltage pMOS transistor 21. The other terminal of the medium threshold voltage nMOS transistor 23 is connected to the ground potential GND. The logic circuit L3 in the CMOS logic circuit C1 is also composed in the same fashion as the logic circuit L2.

Figure 4:
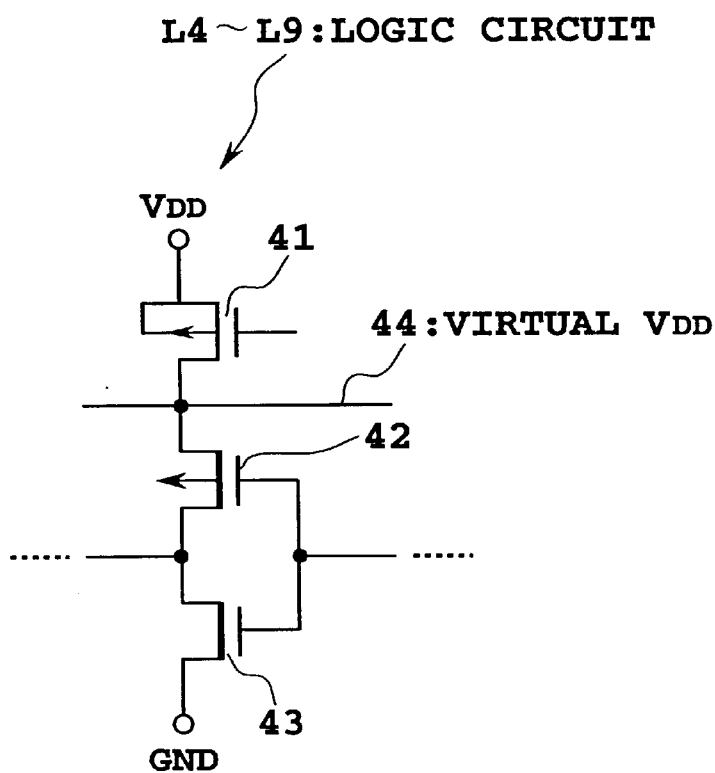
FIG. 4 is a circuit diagram showing a specific embodiment of a logic gate in the logic circuits L4–L9 in FIG. 1.

FIG. 4 shows a specific embodiment of a logic gate in the logic circuits L4–L9 in the CMOS logic circuit C1.

The logic gate of the logic circuit L4 includes a series connection of a low threshold voltage pMOS transistor 42 and a low threshold voltage nMOS transistor 43. The power supply $V_{DD}$ is connected to a virtual high potential power supply line (Virtual $V_{DD}$) 44 via a high threshold voltage pMOS transistor 41. The other terminal of the low threshold voltage nMOS transistor 43 is connected to the ground potential GND. The logic circuits L5–L9 in the CMOS logic circuit C1 are each composed in the same fashion as the logic circuit L4.

FIG. 5 illustrates the symbols of the nMOS transistors and pMOS transistors as shown in FIGS. 1–4, for the respective three types of threshold voltages.

In the CMOS logic circuit C1, the logic circuits L1, L2 and L3 have a margin for speed, and are each composed of medium threshold voltage MOS transistors or high threshold voltage MOS transistors. The medium threshold voltage MOS transistors or high threshold voltage MOS transistors have a lower leakage current in the operation mode compared with low threshold voltage transistor, so that the power consumed is reduced by an amount corresponding to the low leakage current in the operation mode. Accordingly, the total power consumption of the CMOS logic circuit C1 is reduced by an amount equal to the reduced power consumption by the logic circuits L1, L2 and L3.

Figure 6A:
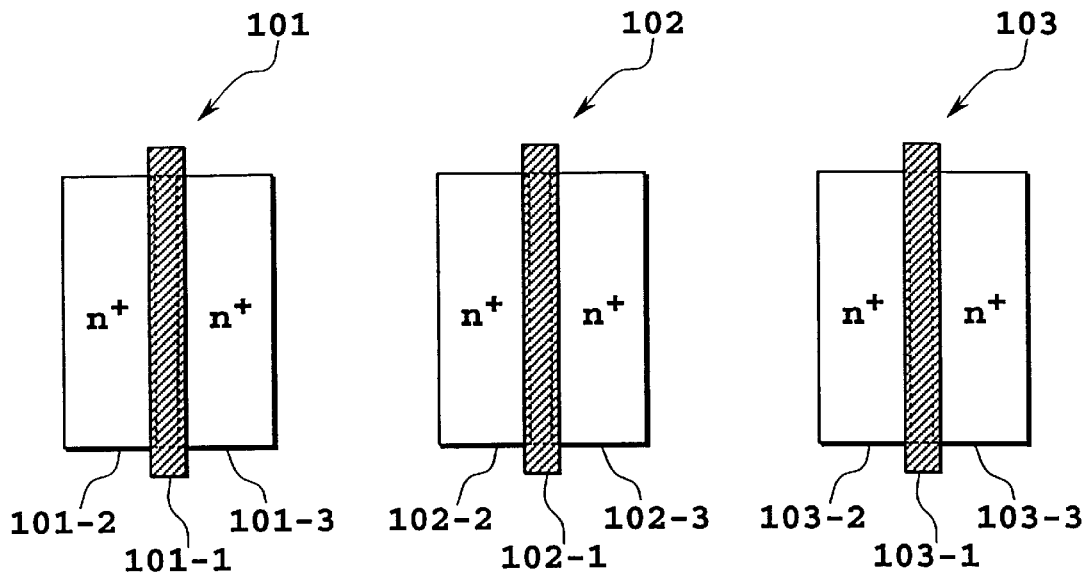
FIGS. 6A and 6B are plan and cross-sectional views, respectively, showing MOS transistors with low, medium and high threshold voltages used in the logic circuit in accordance with the present invention.
Figure 6B:
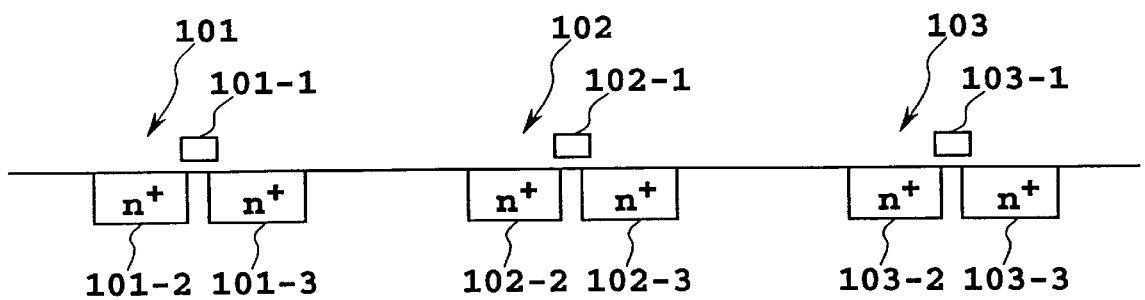
Figure 7A:
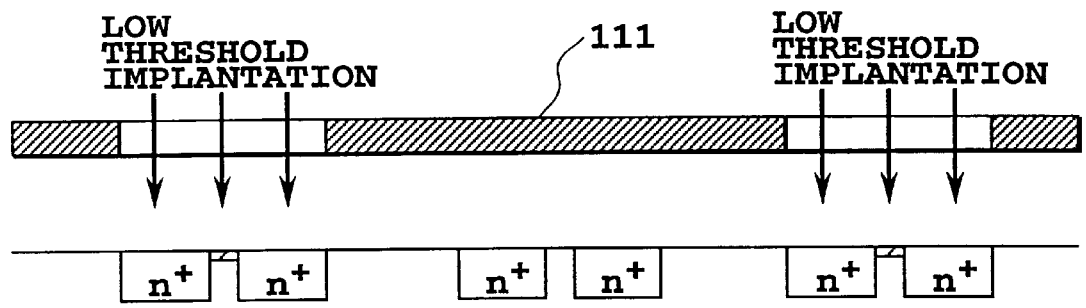
FIGS. 7A and 7B are cross-sectional views showing a fabrication process of the MOS transistors shown in FIGS. 6A and 6B in accordance with the present invention.
Figure 7B:
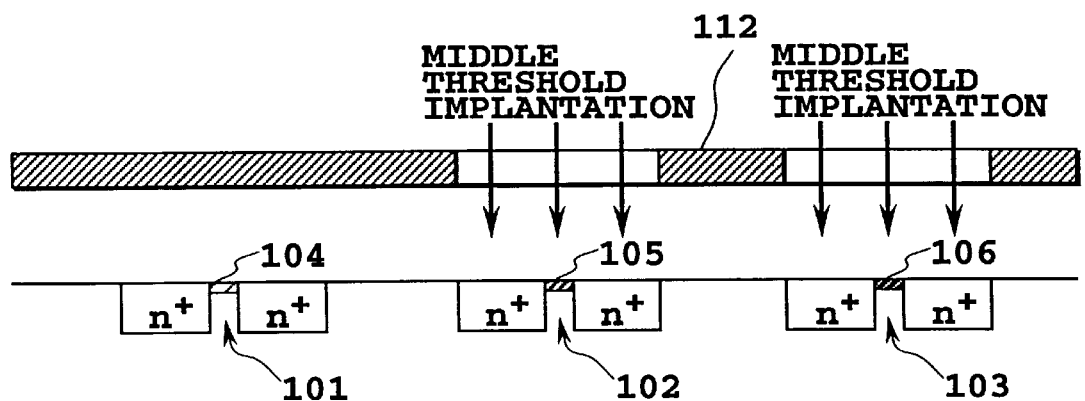
Figure 8A:
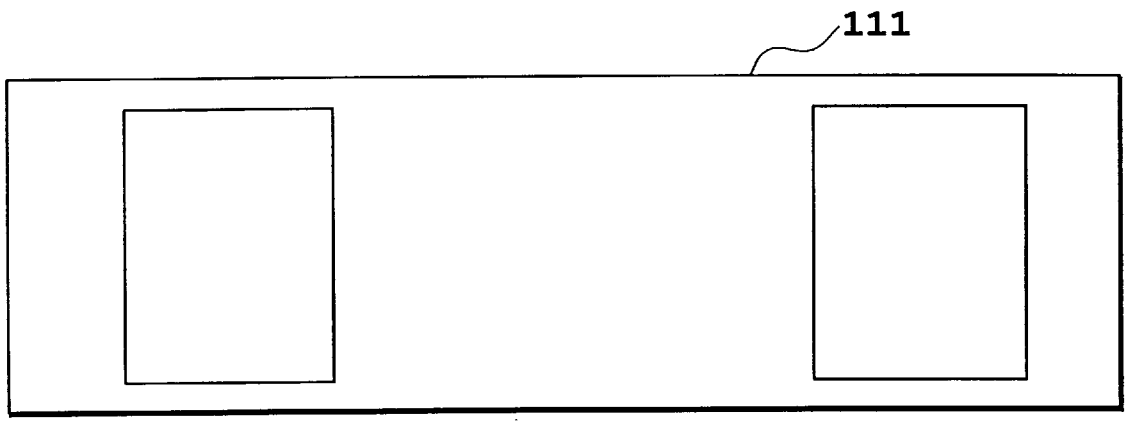
FIGS. 8A and 8B are plan views showing the masks for low and medium ion implantation used in the fabrication process shown in FIGS. 7A and 7B.
Figure 8B:
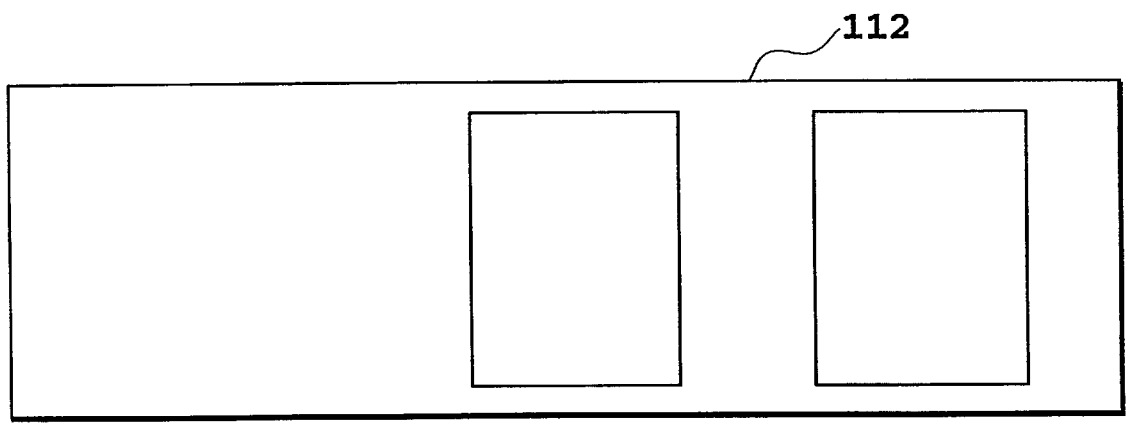

FIGS. 7A and 7B show a fabrication method in accordance with the present invention, in which the low, medium and high threshold voltage nMOS transistors 101, 102 and 103 are fabricated whose layout patterns are shown in FIG. 6A and whose cross-sections are shown in FIG. 6B. Here, reference numerals 101-1, 102-1 and 103-1 designate their gate electrodes, 101-2, 102-2 and 103-2 designate their drain regions, and 101-3, 102-3 and 103-3 designate their source regions. First, the ion implantation of the low threshold impurity is carried out as shown in FIG. 7A by using a low threshold mask 111 as shown in FIG. 8A. Second, the ion implantation of the medium threshold impurity is carried out as shown in FIG. 7B by using a medium threshold mask 112 as shown in FIG. 8B. Thus, channel regions 104, 105 and 106 with low, medium and high impurity concentrations respectively are formed. That is, the low threshold voltage, medium threshold voltage and high threshold voltage MOS transistors 101, 102 and 103 are formed which have the layout patterns as shown in FIG. 6A and the cross-sections as shown in FIG. 6B.

FIGS. 9A–9J illustrate a specific embodiment of process steps of the fabrication method in accordance with the present invention as shown in FIGS. 7A and 7B.

Figure 9A:
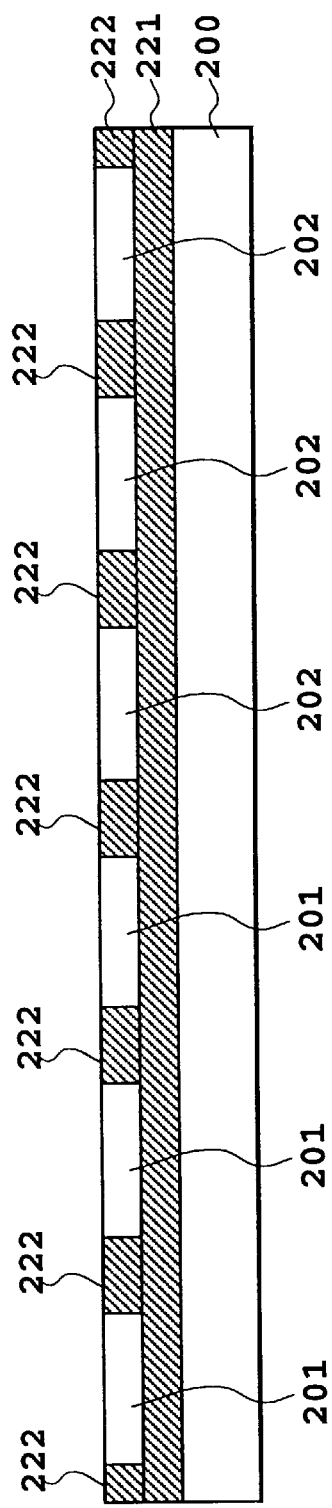

The outline of the steps of the fabrication process is as follows:

(1) As shown in FIG. 9A, pMOS device regions 201 and nMOS device regions 202 are formed on a silicon substrate 200 and isolated from each other. Here, reference numerals 221 and 222 each designate an $SiO_2$ insulation layer.

Figure 9B:
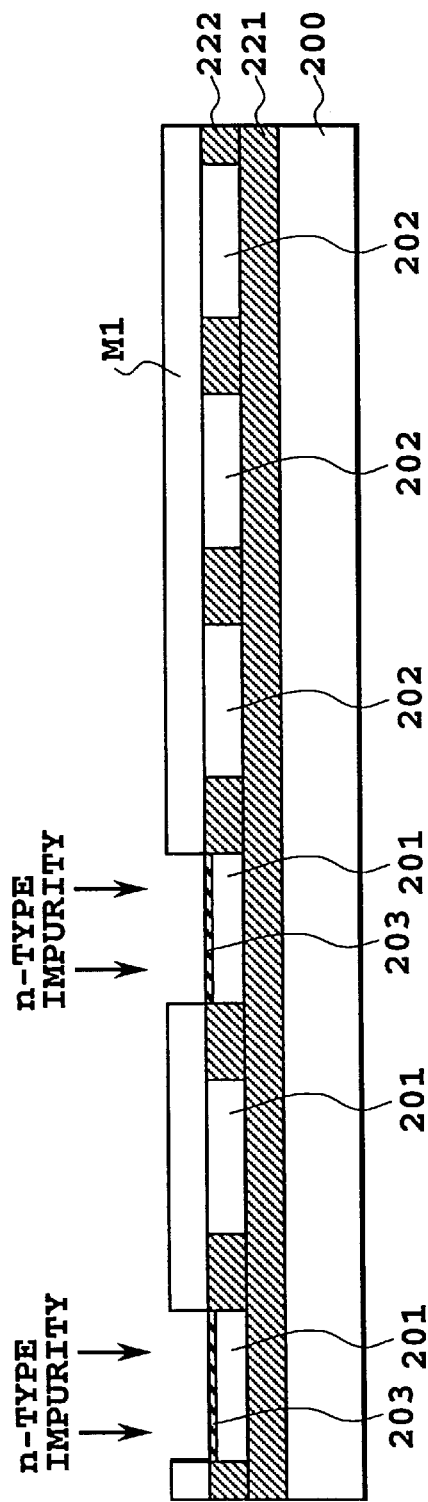

(2) As shown in FIG. 9B, after forming a resist mask M1 with openings corresponding to a high threshold pMOS device region and a low threshold pMOS device region, the ion implantation of an n-type impurity (phosphorus) is carried out by using the mask M1, thereby forming regions 203, each having an impurity concentration of Npl, near the surface of the device regions 201.

(3) As shown in FIG. 9C, after forming a resist mask M2 with openings corresponding to a high threshold pMOS device region and a middle threshold pMOS device region, the ion implantation of the n-type impurity (phosphorus) is carried out by using the mask M2, thereby forming a region 204 with an impurity concentration of Npm and a region 205 with an impurity concentration of (Npl+Npm), near the surface of the device regions 201. Thus, a pMOS device region 230 is formed which has the three types of the low, medium and high threshold voltage and whose ion impurity concentrations are Npl, Npm and (Npl+Npm), respectively, through steps (2) and (3).

(4) As shown in FIG. 9D, after forming a resist mask M3 with openings corresponding to a high threshold NMOS device region and a low threshold nMOS device region, the ion implantation of a p-type impurity (boron) is carried out by using the mask M3, thereby forming regions 206, each having an impurity concentration of Nnl, near the surface of the device regions 202.

(5) As shown in FIG. 9E, after forming a resist mask M4 with openings corresponding to a high threshold nMOS device region and a medium threshold nMOS device region, the ion implantation of the p-type impurity (boron) is carried out by using the mask M4, thereby forming a region 207 with an impurity concentration of Nnm and a region 208 with an impurity concentration of (Nnl+Nnm), near the surface of the device regions 202. Thus, an NMOS device region 240 is formed which has the three types of the low, medium and high threshold values and whose ion impurity concentrations are Nnl, Nnm and (Nnl+Nnm), respectively, through steps (4) and (5).

(6) Subsequently, after forming a gate oxide film on the surface of the substrate 200, a p-type polysilicon is grown with boron doped thereinto on the gate oxide film in the pMOS device regions. The p-type polysilicon is patterned to form gate electrodes 209 in respective pMOS device regions, as shown in FIG. 9E.

Figure 9G:
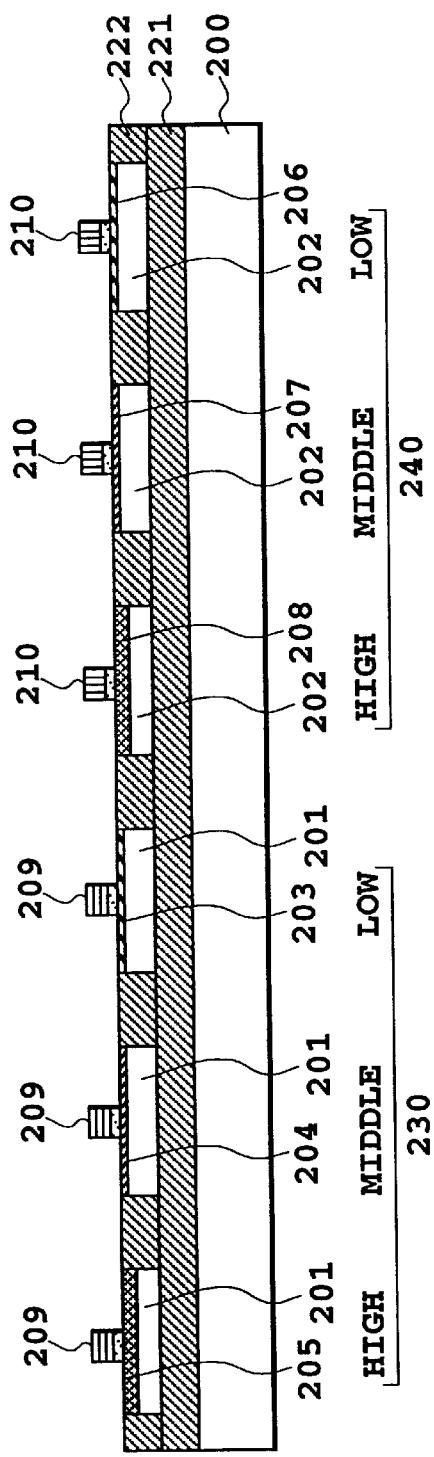

(7) In a similar way, an n-type polysilicon is grown with doping phosphorus doped thereinto on the gate oxide film in the nMOS device regions. The n-type polysilicon is patterned to form gate electrodes 210 in respective nMOS device regions, as shown in FIG. 9G.

Figure 9H:
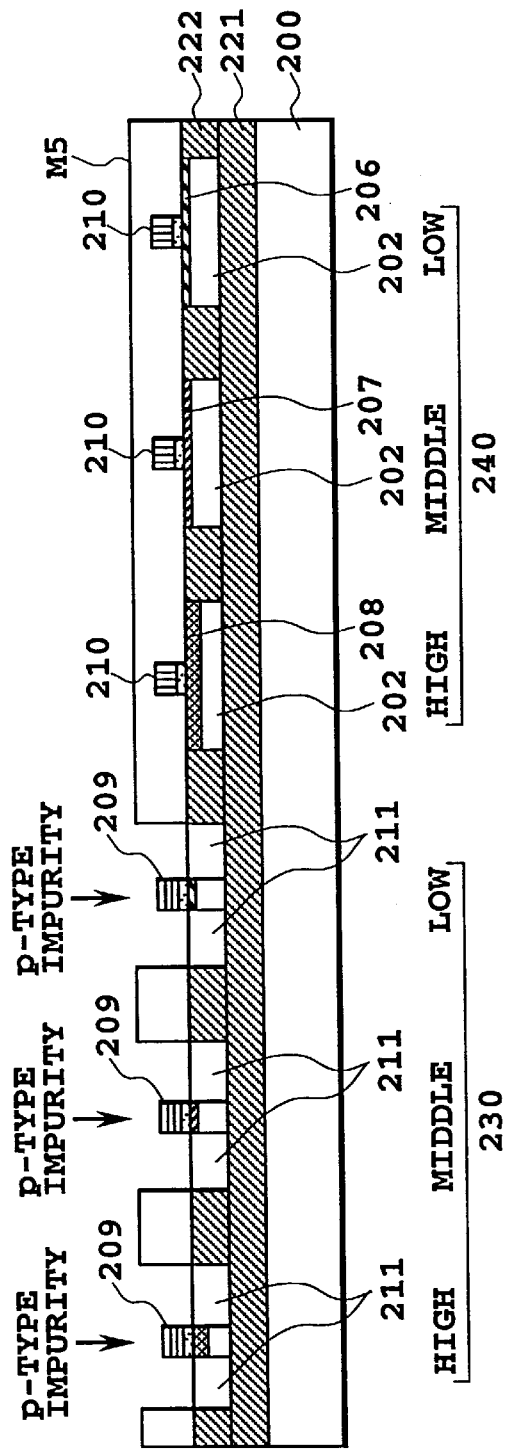

(8) As shown in FIG. 9H, after forming a resist mask M5 with openings corresponding to pMOS device regions, the ion implantation of the p-type impurity (boron) is carried out, thereby forming high impurity concentration source and drain regions 211 of the pMOS device.

Figure 9I:
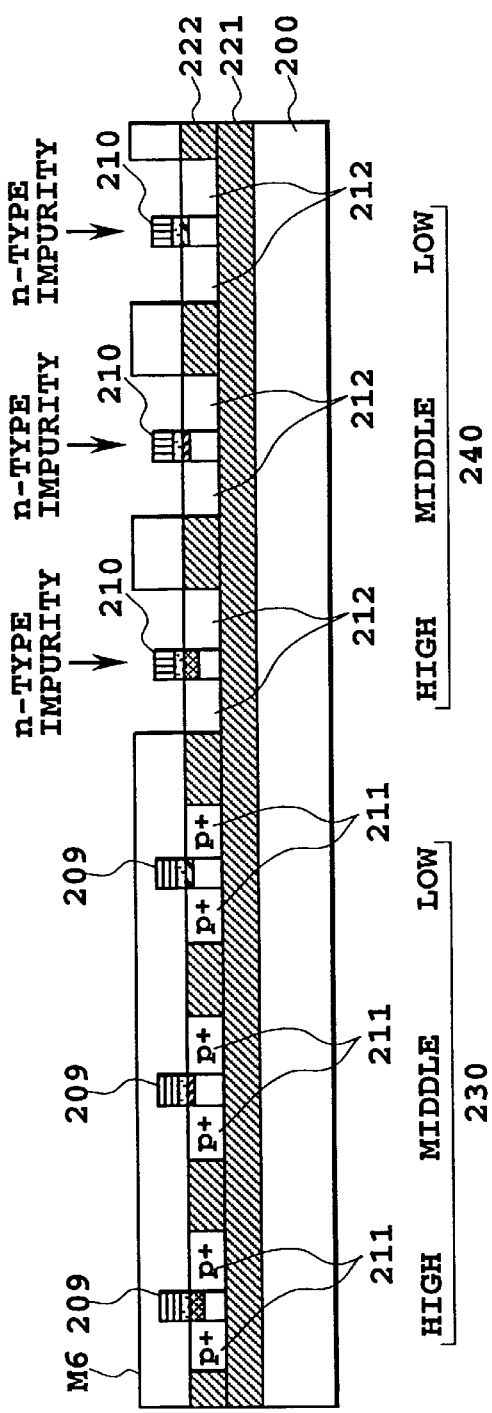

(9) As shown in FIG. 9I, after forming a resist mask M6 with openings corresponding to nMOS device regions, the ion implantation of the n-type impurity (phosphorus) is carried out, thereby forming high impurity concentration source and drain regions 212 of the NMOS device.

Figure 9J:
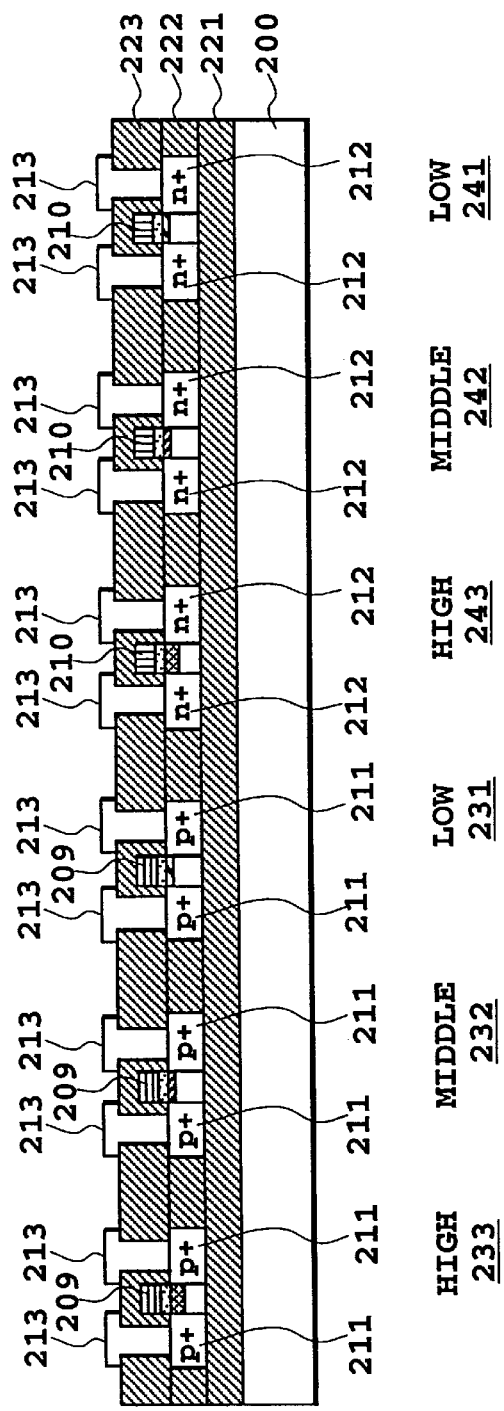

(10) Then, after growing an insulation layer 223 on the entire surface, electrode windows are opened. Subsequently, a wiring metal layer is grown on the insulation layer 223. The wiring metal layer is patterned so as to form source and drain electrodes 213, as shown in FIG. 9J.

Thus are formed the low, medium and high threshold pMOS transistors 231, 232 and 233, and the low, medium and high threshold nMOS transistors 241, 242 and 243.

Figure 10:
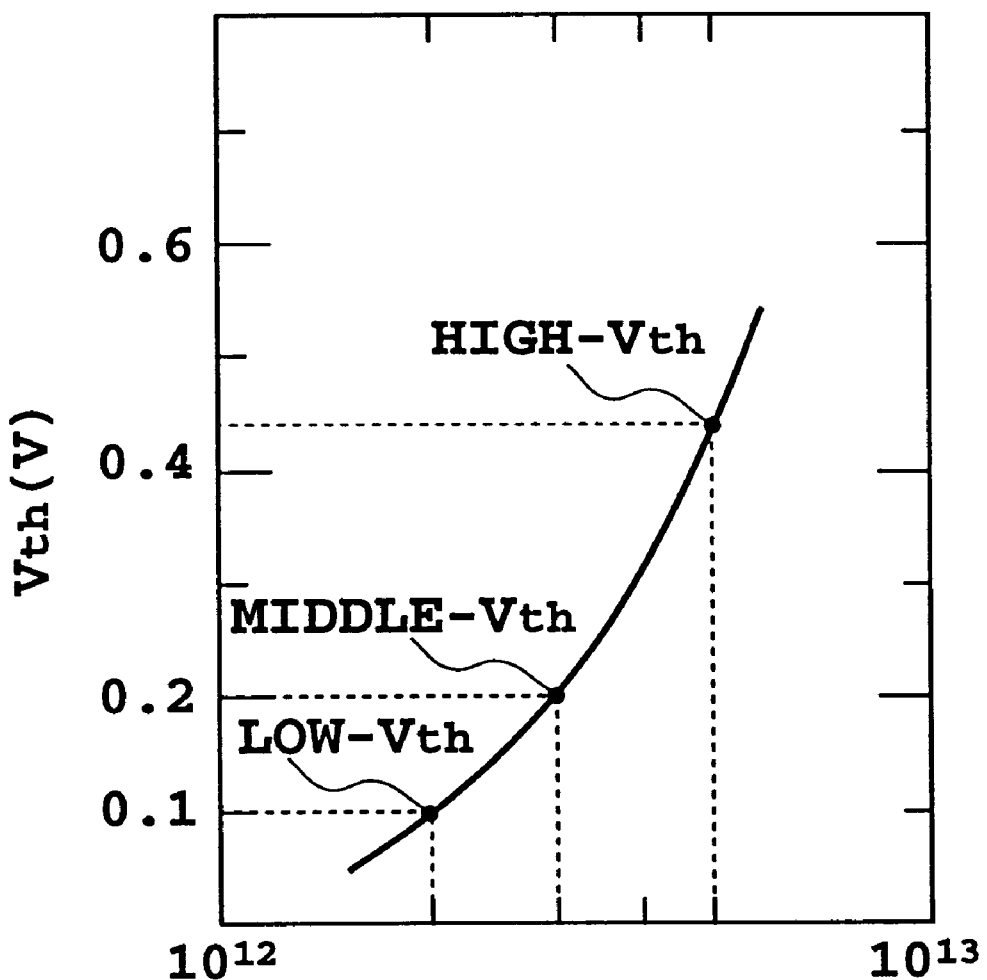
FIG. 10 is a characteristic diagram illustrating relationships between the impurity concentration in a channel region and a threshold voltage.

FIG. 10 is a characteristic diagram illustrating relationships between the impurity concentration ($cm^{-2}$) in a channel region formed by the ion implantation and the threshold voltage $V_{th}$ (V). If the low threshold voltage is set at 0.1 V and the medium threshold voltage is set at 0.2 V, it is possible to fabricate a high threshold voltage MOS transistor having a threshold voltage of about 0.4 V. This method offers an advantage that the three threshold MOS transistors can be fabricated by the same process as the fabrication for the two threshold MOS transistors. Thus, the present invention has an advantage that the number of the process steps is not increased and that the number of the masks is the same as that for fabricating the two threshold MOS transistors.

Embodiment 2

Figure 11:
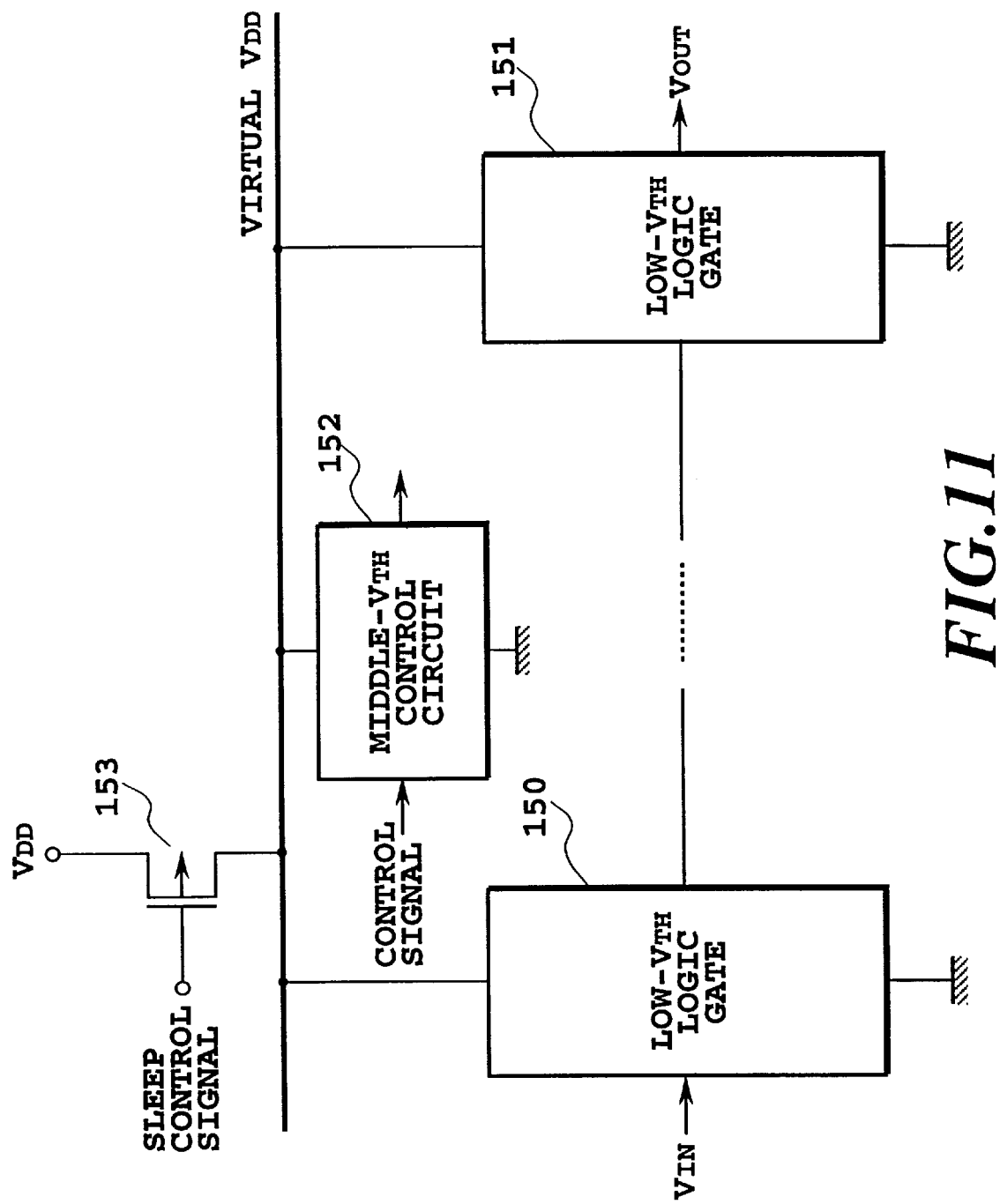
FIG. 11 is a block diagram showing a second embodiment of a logic circuit in accordance with the present invention.

FIG. 11 shows a second embodiment of the present invention. In this embodiment, low threshold logic gates 150 and 151 are interposed in a critical path between an input signal $V_{IN}$ and an output signal $V_{OUT}$. In addition, a medium threshold logic gate 152 is interposed in a non-critical path to which a signal like a control signal is input. Furthermore, a high threshold power switching transistor 153, which is turned on and off by a sleep control signal, is connected between the supply voltage $V_{DD}$ and the Virtual $V_{DD}$ line which is connected to the low threshold logic gates 150 and 151 and the medium threshold logic gate 152. This high threshold voltage transistor makes it possible to reduce the leakage current of each of the gates 150, 151 and 152, thereby achieving high operating speed and low power consumption in the operation mode, and low power consumption in the sleeping mode.

Embodiment 3

Figure 12:
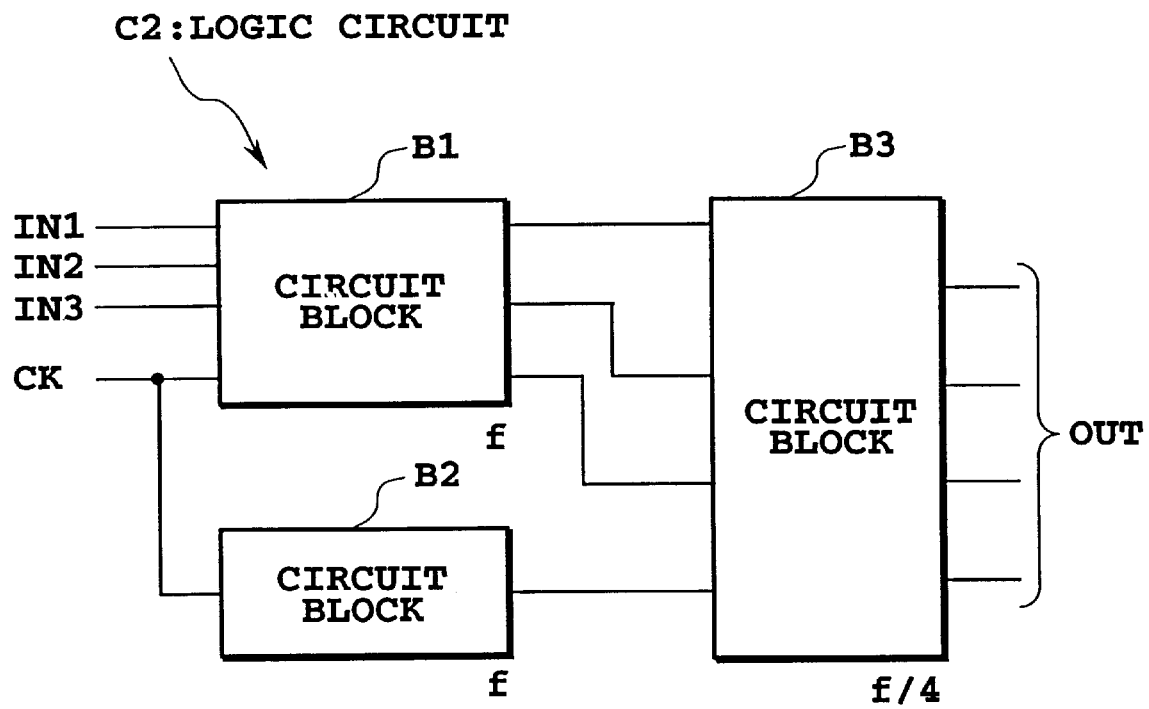
FIG. 12 is a block diagram showing a third embodiment of a logic circuit in accordance with the present invention.

FIG. 12 is a block diagram showing a third embodiment of a logic circuit C2 in accordance with the present invention. The logic circuit C2 is an example of a sequential circuit to which the present invention is applied. It includes circuit blocks B1, B2 and B3, and f designates an operation frequency. The circuit blocks B1 and B2 operate at the frequency f, and the circuit block B3 operates at the frequency f/4. Thus, the circuit blocks B1 and B2 determine the maximum operation frequency of the logic circuit C2. Here, IN1, IN2 and IN3 designate input signals, OUT designates an output signal, and CK designates a clock signal.

Figure 13:
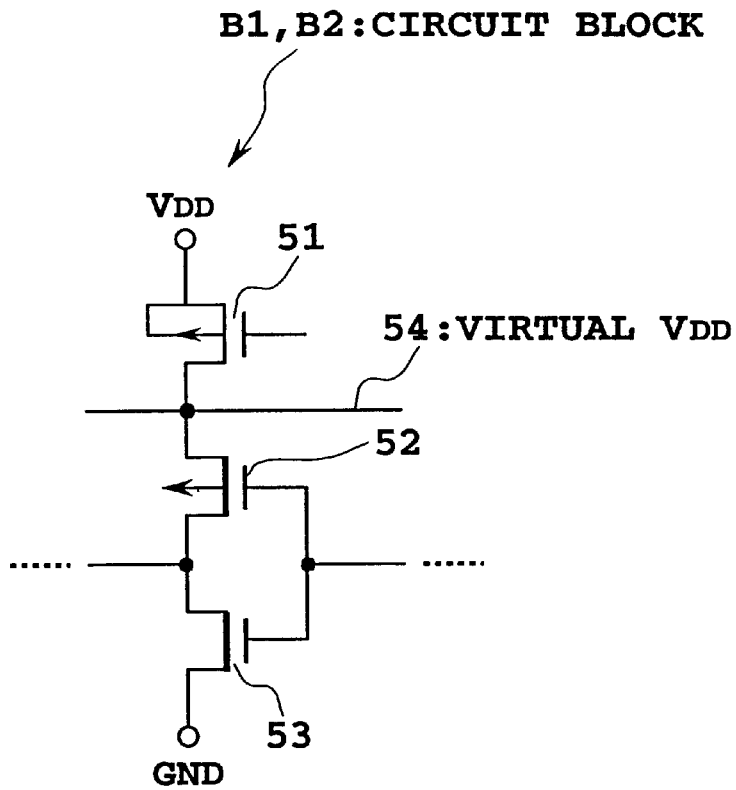
FIG. 13 is a circuit diagram showing a specific embodiment of a logic gate in the circuit blocks B1 and B2 in FIG. 12.

FIG. 13 shows a specific embodiment of a logic gate constituting the circuit block B1 or B2 in the logic circuit C2.

The logic circuit C2 is an embodiment in which the present invention is applied to a sequential circuit, and its component circuit blocks B1 and B2 can be the same as the logic circuits L4–L9 constituting the logic circuit C1. In FIG. 13, the circuit block B1 is shown as having the same structure as the logic circuit L4. The circuit blocks B1 and B2, however, may have an arrangement different from the logic circuit L4.

In FIG. 13, the circuit block B1 includes a low threshold voltage pMOS transistor 52 and a low threshold voltage nMOS transistor 53 connected in series, and the power supply line $V_{DD}$ is connected to a virtual high potential power supply line 54 via a high threshold voltage pMOS transistor 51. The other terminal of the nMOS transistor 53 is grounded.

Figure 14:
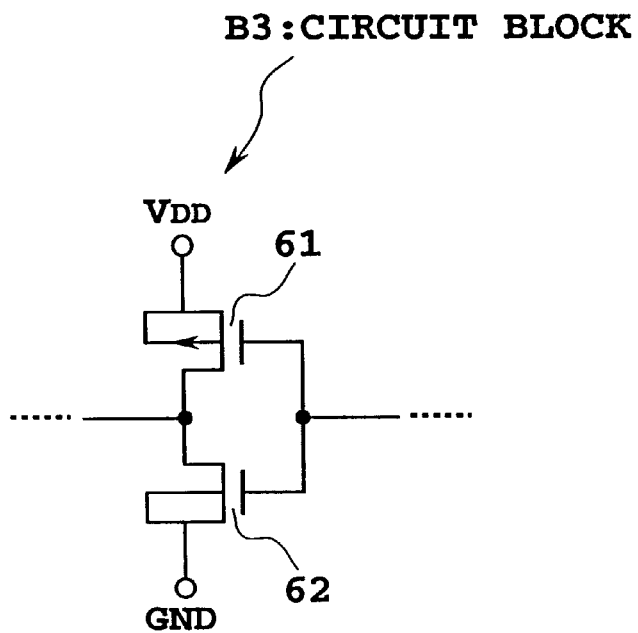
FIG. 14 is a circuit diagram showing a specific embodiment of a logic gate in the circuit block B3 in FIG. 12.

FIG. 14 shows a specific embodiment of a logic gate constituting the circuit block B3 in the logic circuit C2.

The circuit block B3 is composed of a high threshold voltage pMOS transistor 61 and a high threshold voltage nNOS transistor 62 like the logic circuit L1.

In the logic circuit C2, the logic gates of the circuit blocks B1 and B2 are composed of the low threshold voltage MOS transistors 52 and 53. The circuit block B3, on the other hand, uses the high threshold voltage MOS transistors 61 and 62. This is because the circuit block B3 is used in a portion other than the critical portion which determines the maximum operation frequency of the logic circuit C2, so that it can be composed of a circuit block synchronized with a clock signal having a lower frequency than the maximum operation frequency. With this arrangement, the power consumption in the circuit block B3 can be reduced. Thus, the total power consumption of the sequential circuit, i.e., the logic circuit C2, can be reduced by an amount corresponding to the reduction in the circuit block B3.

Further, the high threshold voltage MOS transistors 61 and 62 can be replaced by medium threshold voltage MOS transistors. In this case also, the power consumption in the circuit block B3 is reduced, and hence the total power consumption of the sequential circuit, the logic circuit C2, can be reduced by an amount corresponding to the reduction in the circuit block B3.

Figure 15:
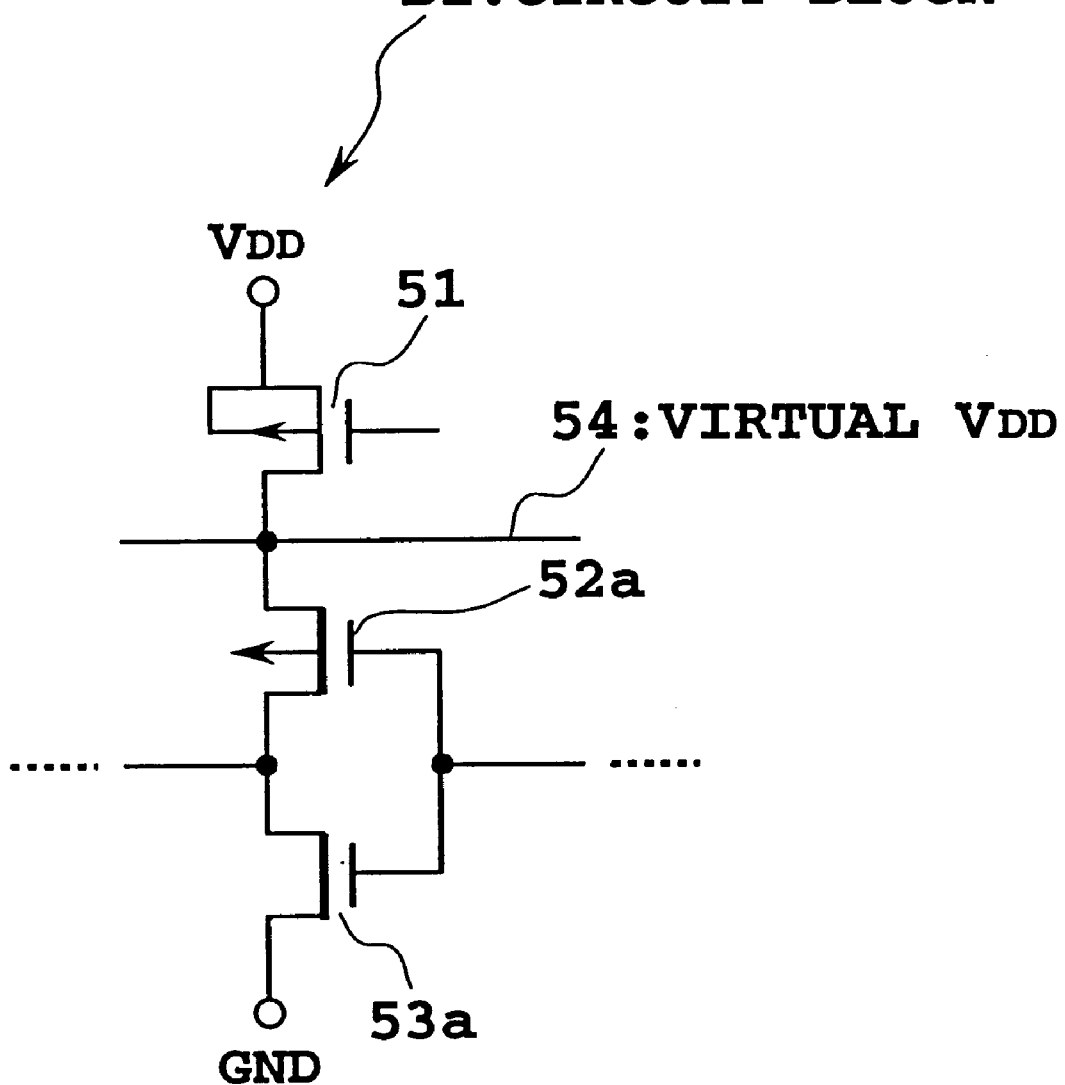
FIG. 15 is a circuit diagram showing a modification of the logic gate in the circuit block B1 in FIG. 12.

FIG. 15 is a circuit diagram showing another embodiment of the circuit block B1.

The circuit block B1, which can be considered as a modification of the logic circuit L4, includes a low threshold voltage pMOS transistor 52a and a low threshold voltage nMOS transistor 53a connected in cascade. The power supply line $V_{DD}$ is connected to a virtual high potential power supply line 54 (Virtual $V_{DD}$) via a high threshold voltage pMOS transistor 51.

In the circuit block B1 shown in FIG. 15, the transistors 51, 52a and 53a have the SOI structure, and the low threshold voltage MOS transistors 52a and 53a are fully depleted transistors.

In the fully depleted transistor, it is unnecessary for the substrate potential to be fixed, and hence terminals or wiring for fixing the substrate potential can be obviated. "Not fixing the substrate potential of an MOS transistor" means "making the body of an MOS transistor floating". Usually, the substrate potentials of an nMOS transistor and a pMOS transistor are fixed at the ground level and the power supply VDD level, respectively. Thus, employing the fully depleted MOS transistors enables an area occupied by the logic gates to be reduced by an amount corresponding to the terminals and wiring as compared with the conventional devices.

Furthermore, the fully depleted transistor can also be used as the high threshold voltage MOS transistor 51 in the circuit block B1 as shown in FIG. 15, besides the low threshold voltage MOS transistors 52a and 53a. Moreover, the low threshold voltage MOS transistors 52a and 53a in the circuit block B1 as shown in FIG. 15 may be replaced by medium threshold voltage MOS transistors, and the fully depleted transistor can be employed as the medium threshold voltage MOS transistors. In this case, the fully depleted transistor can also be used as the high threshold voltage MOS transistor 51.

The above description about the circuit block B1 can also be applied to the logic circuit L4 and so on. Thus, considering the logic circuit L4, the transistors 41, 42 and 43 may have the SOI structure, and the low threshold voltage MOS transistors 42 and 43 may be fully depleted transistors. Furthermore, the fully depleted transistor can also be used as the high threshold voltage MOS transistor 41 in the logic circuit L4, besides the low threshold voltage MOS transistors 42 and 43. Moreover, the low threshold voltage MOS transistors 42 and 43 in the logic circuit L4 may be replaced by medium threshold voltage MOS transistors, and the fully depleted transistor can be employed as the medium threshold voltage MOS transistors. In this case, the fully depleted transistor can also be used as the high threshold voltage MOS transistor 41.

Generally speaking, a logic gate composed of low threshold voltage MOS transistors has a large power consumption, although its operating speed is high. In contrast, a logic gate composed of high threshold voltage MOS transistors has a smaller power consumption although its operating speed is lower. Among the logic gates in a logic circuit, some require a higher operating speed, and others do not. In view of this background, the foregoing embodiments employ the low threshold voltage MOS transistors in portions requiring a higher operating speed to ensure the high operating speed of the logic circuit, while applying the high threshold voltage MOS transistors to portions having more margin for speed so as to reduce the power consumption of the latter portions, thereby reducing the total power consumption of the logic circuit. As a result, the present invention can reduce the total power consumption of the logic circuit, while maintaining the required operating speed.

Table 1 shows examples of the three types of threshold voltages of the MOS transistors in the foregoing embodiments.

TABLE 1

| MOS Transistor | | Threshold voltage $|V_{th}|$ [V] |
|---|---|---|
| High threshold voltage | nMOS Transistor | 0.38 |
| Medium threshold voltage | nMOS Transistor | 0.26 |
| Low threshold voltage | nMOS Transistor | 0.13 |
| High threshold voltage | pMOS Transistor | 0.44 |
| Medium threshold voltage | pMOS Transistor | 0.31 |
| Low threshold voltage | pMOS Transistor | 0.18 |

Figure 16:
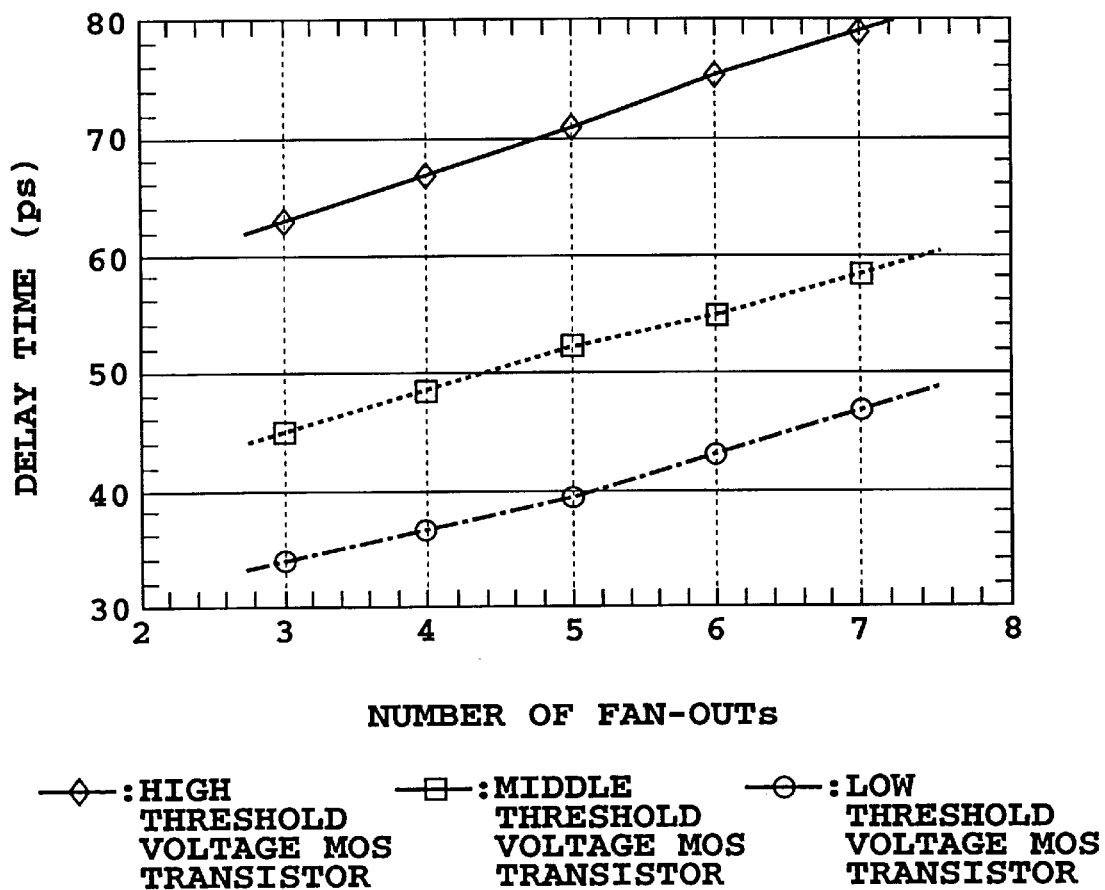
FIG. 16 is a characteristic diagram comparatively illustrating relationships between the number of fan-outs and delay times of a two-input NAND gate composed of three types of MOS transistors with low, medium and high threshold voltages.

FIG. 16 is a characteristic diagram showing the results of relationships between signal propagation delay times and the number of fan-outs for loads in three types of two input NAND circuits, each of which is composed of three types of MOS transistors respectively, as shown in Table 1. The results were computed by the circuit simulation.

The ratios of the propagation delay times of the three types of the two input NAND circuits each composed of the low threshold voltage, middle threshold voltage and high threshold voltage MOS transistors are 1:1.32:1.8. It is found that the leakage current can be reduced by about one order of magnitude by increasing the threshold voltage by about 100 mV, in the case in which a subthreshold characteristic (that is, a $V_D$-$I_D$ characteristic when the gate voltage is less than the threshold voltage and the surface is in a weakly inverted state) is assumed to be S≅70 mV/decade.

Thus, if a MOS transistor in the logic circuit has a speed margin equal to or smaller than 1.5, a medium threshold voltage MOS transistor can be used as that MOS transistor instead of a low threshold voltage MOS transistor which was used in the logic gate to satisfy the required speed margin. Furthermore, if a MOS transistor has a speed margin equal to or smaller than 2.0, the high threshold voltage MOS transistor can be used as that MOS transistor instead of a low threshold voltage MOS transistor which was used in the logic gate to satisfy the required speed margin. Replacing low threshold voltage MOS transistors by medium threshold voltage MOS transistors or high threshold voltage MOS transistors enables the leakage current in the operation mode to be reduced by one or two orders of magnitude as compared with that of the replaced MOS transistors, thereby reducing the total power consumption of the logic circuit.

Although the MOS transistors are classified into three types in terms of the threshold voltage in the foregoing embodiments, they can be classified into two types: a first MOS transistor having a threshold voltage lower than a predetermined voltage; and a second MOS transistor having a threshold voltage equal to or higher than the predetermined voltage. Then, the first MOS transistors may be used as the MOS transistors operating at a high speed, and the second MOS transistors may be used as the MOS transistors having a larger speed margin.

Embodiment 4

Figure 17:
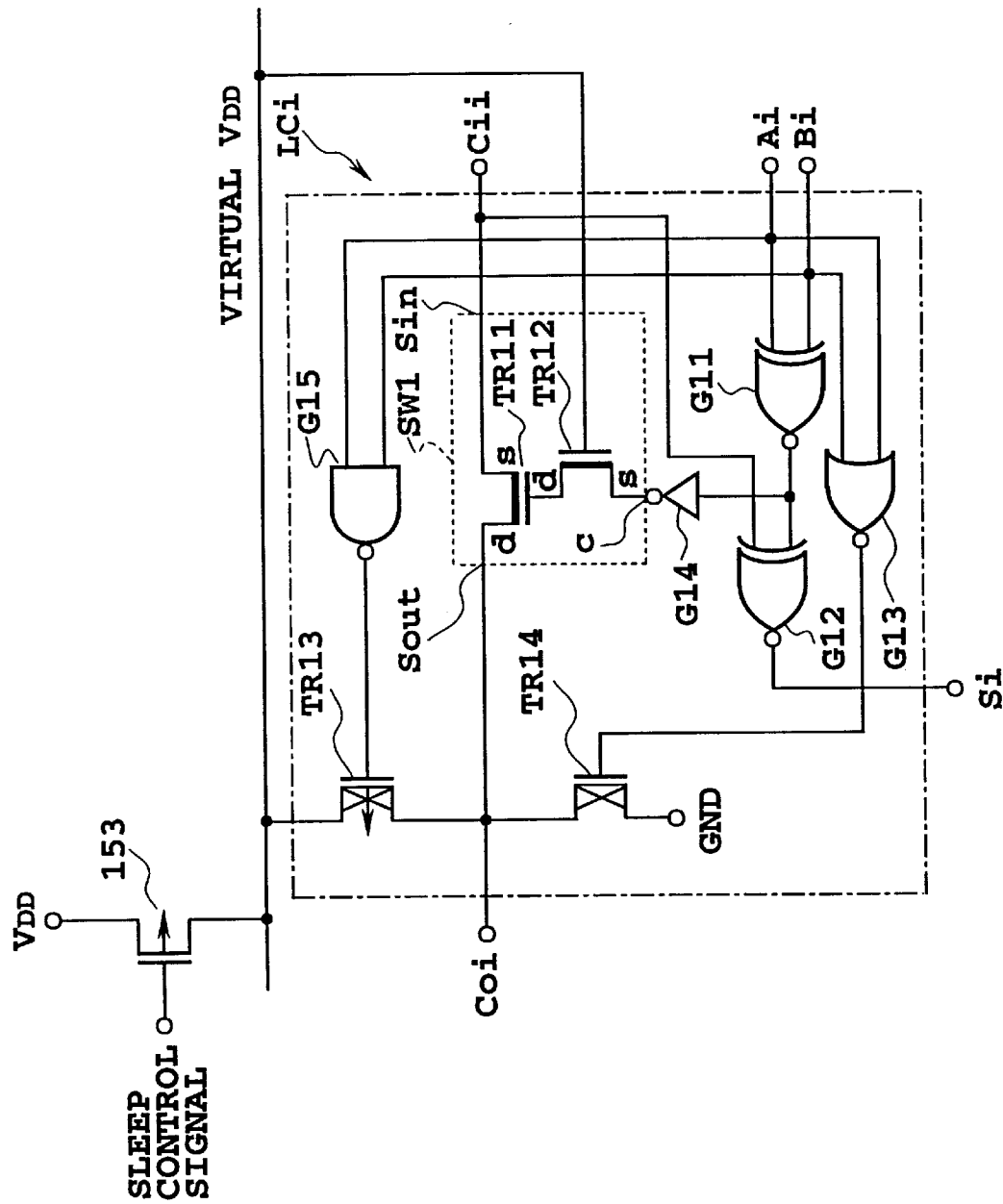
FIG. 17 is a circuit diagram showing a full adder as a fourth embodiment of a logic circuit in accordance with the present invention.

FIG. 17 shows a full adder LCi as a fourth embodiment of a logic circuit in accordance with the present invention. The full adder LCi includes gates G11–G12 for performing addition, a switching circuit SW1, a gate G14 for controlling the switching circuit SW1, medium threshold MOS transistors TR13 and TR14, and gates G13 and G15 for controlling the MOS transistors TR14 and TR13, respectively. The switching circuit SW1 includes a low threshold nMOS transistor TR11 functioning as a transfer gate for propagating a carry signal, and a low threshold nMOS transistor TR12 for controlling the low threshold nMOS transistor TR11. The switching circuit SW1 includes a first n-channel enhancement MOSFET TR11 having a source s connected to the signal input terminal Sin and a drain d connected to the signal output terminal Sout, and a second n-channel enhancement MOSFET TR12 having a gate connected to the supply line virtual $V_{DD}$, a source s connected to the control terminal c and a drain d connected to the gate of the first n-channel enhancement MOSFET TR11. The body of the nMOS transistor TR11 and the body of the nMOS transistor TR12 are made floating. The gates G11–G15 are each composed of a medium threshold MOS transistor. In FIG. 17, Ai and Bi designate adder inputs, Si designates an adder output, Cii designates a carry input and Coi designates a carry output.

The operation of the full adder as shown in FIG. 17 will now be described. A carry propagation control signal at the terminal c of the switching circuit SW1 can be expressed as $c = Ai \oplus Bi$ using the input signals Ai and Bi. This means that c="1" only when one of the input signals Ai and Bi is "1"

and the other is "0", so that the low threshold MOS transistor TR11 enters a conductive state. As a result, the carry signal Cii fed from the previous stage is transferred to the output terminal Coi. When both the input signals Ai and Bi are either "0" or "1", the carry propagation control signal c falls "1", so that the transistor TR11 enters a nonconductive state, and hence the carry signal Cii fed from the previous stage is not transferred to the output terminal Coi through the transistor TR11. In this case, one of the pMOS transistor TR13 and the NMOS transistor TR14 which are connected to the carry output terminal Coi conducts so that the carry output terminal Coi is set at "1" or "0".

An n-bit adder can be formed by cascade connection of n full adders shown in FIG. 17. In order to transfer the carry signal without attenuating its amplitude, the signal to the terminal c has to have been determined (that is, set at a high level) in each full adder before the carry input signal Cii arrives.

In the n-bit adder, since the full adder takes a longer time period from the determination of the input bits to that of the carry input signal Cii as its bit position becomes higher, the gates G11 and G14 have a sufficient margin for speed. Accordingly, the operation of the gates G11 and G14 can be ensured, even if they are composed of the medium threshold MOS transistors.

According to this embodiment, the transfer gate is composed of the low threshold voltage nMOS transistor TR11, so that the voltage drop of the carry signal can be reduced during the carry propagation. In addition, the voltage drop of the carry output can also be prevented, because the gate voltage of the transfer gate TR11 is boosted beyond the supply voltage Virtual $V_{DD}$ by controlling the transfer gate TR11 with the low threshold NMOS transistor TR12 functioning as a booster transistor whose gate terminal is connected to the supply line Virtual $V_{DD}$. The gate electrode of the transistor TR12 may be connected to the main power supply $V_{DD}$, instead of the virtual power supply Virtual $V_{DD}$, and this modification has the same effects.

FIGS. 18A and 18B are diagrams showing the waveforms computed by circuit simulation of the signals applied to the input terminal Sin and the control terminal c, and of the signal at the output terminal Sout, using relatively high threshold voltage nMOS transistors as the transistors TR11 and TR12 in the switching circuit SW1.

As shown in FIG. 18A, if the signal arrives at the control terminal c after the signal arrives at the input terminal Sin, the signal at the output terminal Sout does not increase up to the supply voltage. On the contrary, as shown in FIG. 18B, if the signal arrives the control terminal c before the signal arrives at the input terminal Sin, the signal at the output terminal Sout rises to the supply voltage.

Figure 19A:
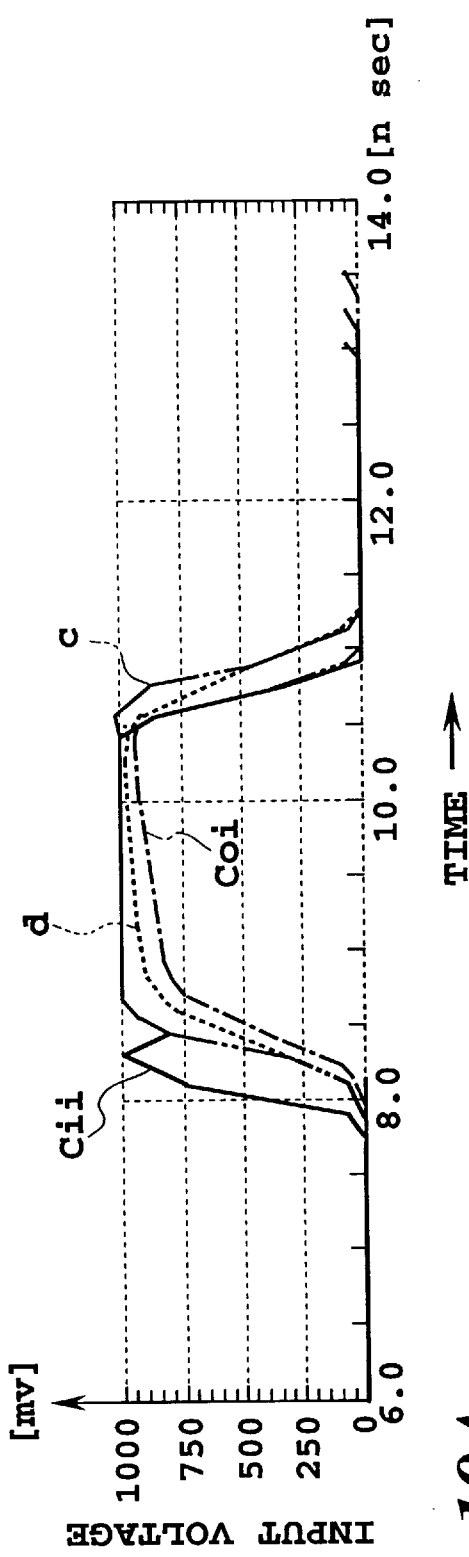
FIGS. 19A and 19B are diagrams plotting voltage at various terminals based on circuit simulation when using low threshold voltage transistors as the MOS transistors of the switching circuit SW.
Figure 19B:
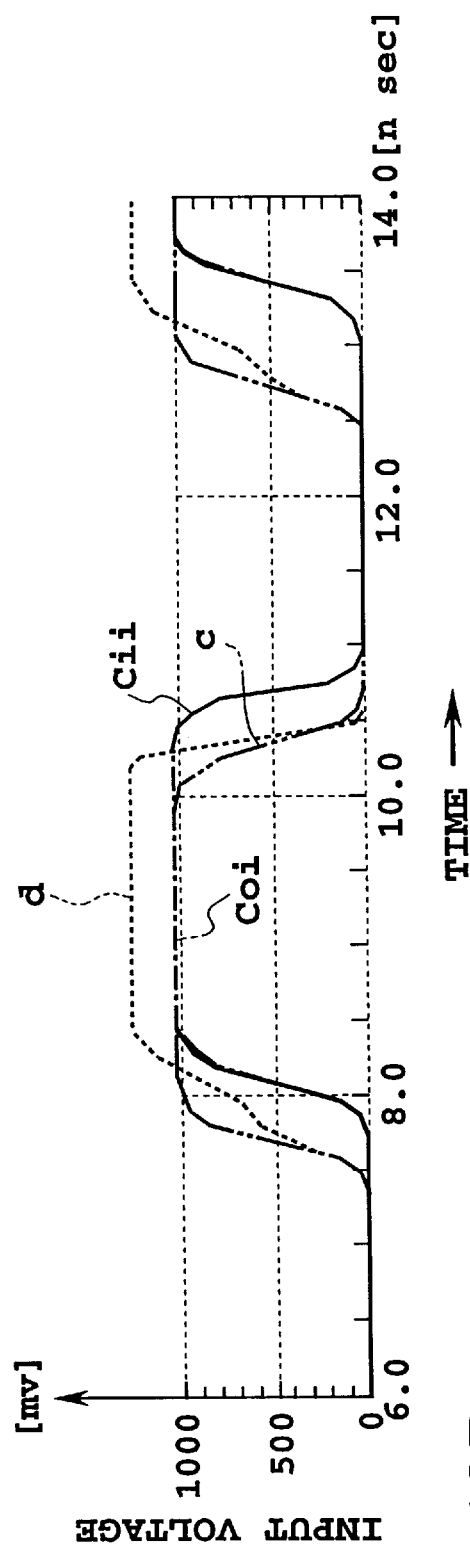

FIGS. 19A and 19B are diagrams showing the waveforms computed by circuit simulation of the signals applied to the input terminal Sin and the control terminal c, and of the signal at the output terminal Sout, using relatively low threshold voltage nMOS transistors as the transistors TR11 and TR12 in the switching circuit SW1.

Even if the signal arrives at the control terminal c after the signal arrives at the input terminal Sin, the effect of the voltage drop can be reduced by using a low threshold voltage MOS transistor as the transfer gate transistor TR11, as shown in FIG. 19A, as compared with the case where a high threshold voltage MOS transistor is used, as shown in FIG. 18A.

According to the present invention, the attenuation of the amplitude of the signal passing through the transfer gate can be prevented.

Figure 20:
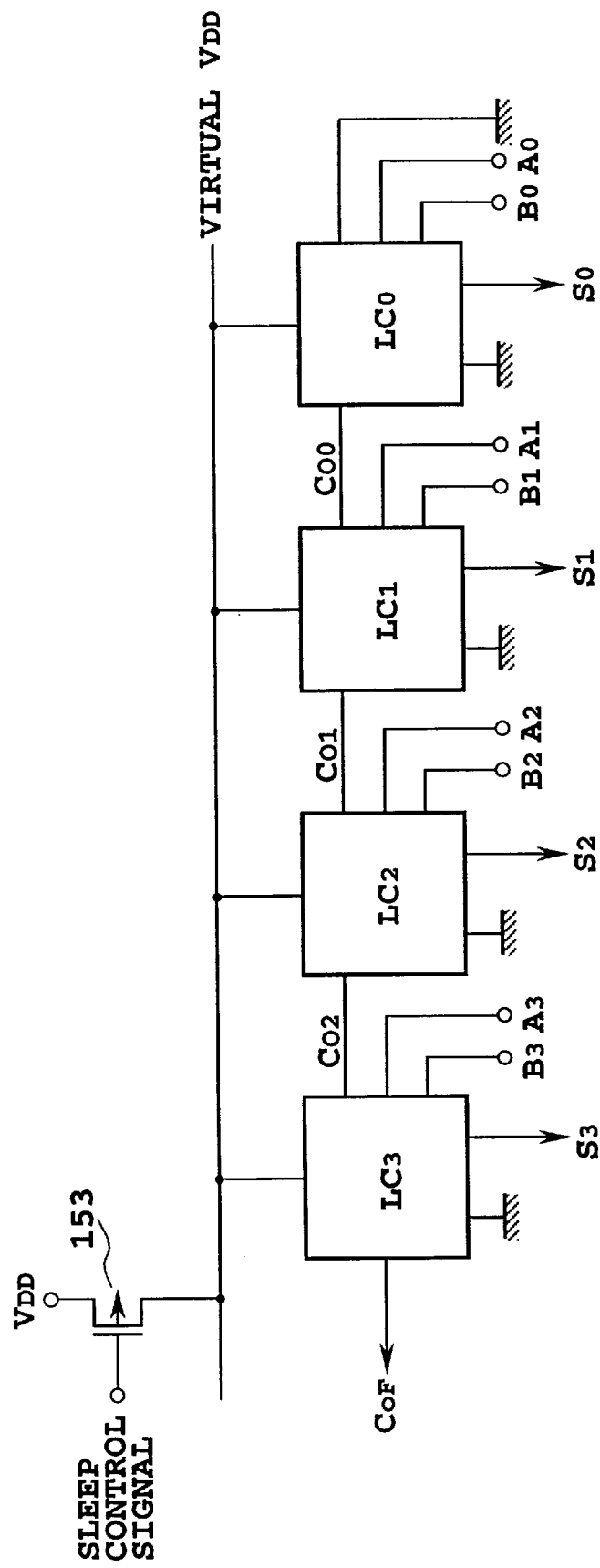
FIG. 20 is a block diagram showing a 4-bit adder composed of the full adders as shown in FIG. 17.

FIG. 20 shows an embodiment of a 4-bit adder arranged by cascade connection of the four adders LCi (i=0, 1, 2 and 3) as shown in FIG. 17. In FIG. 20, $C_{OF}$ designates an overflow output signal of the carry signal. In particular, the higher the bit position, the faster the carry propagation control signal than the carry signal. This offers an advantage of increasing the boosting effect of the booster transistor connected to the transfer gate, thereby achieving a higher operating speed.

Embodiment 5

Figure 21:
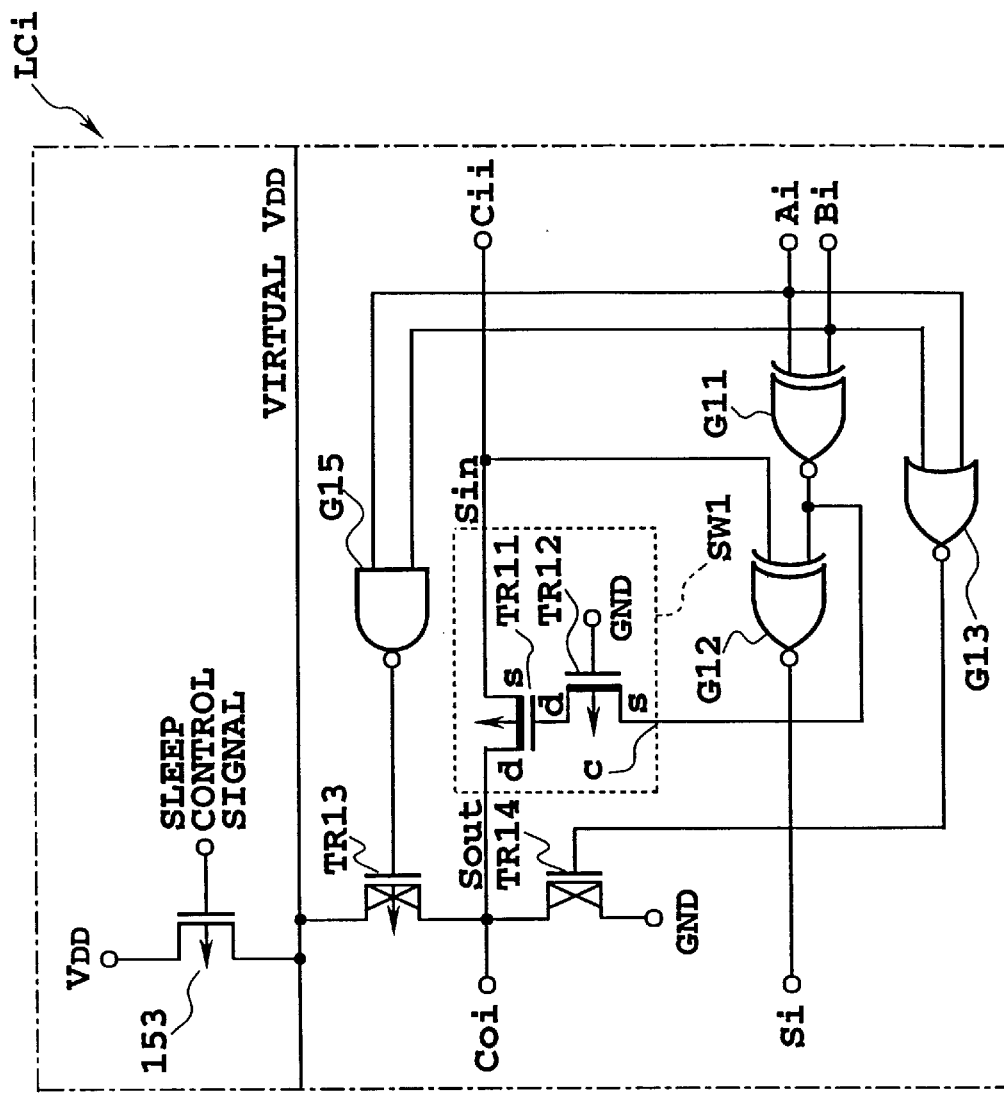
FIG. 21 is a circuit diagram showing a full adder as a fifth embodiment of a logic circuit in accordance with the present invention.
Figure 22:
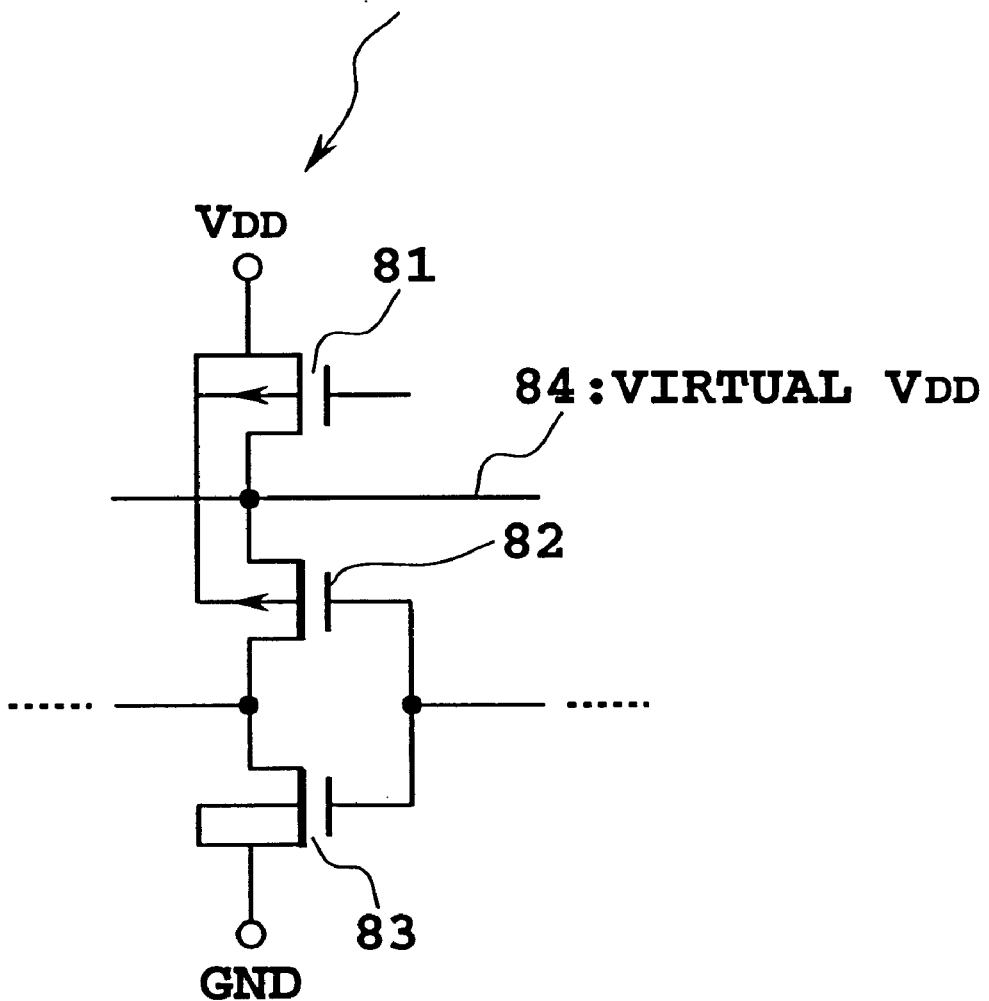
FIG. 22 is a circuit diagram showing an example of a conventional CMOS circuit.

While in FIG. 17, the transistors TR11 and TR12 are nMOS transistors, FIG. 21 shows a fifth embodiment of the present invention where pMOS transistors are used as the transistors TR11 and TR12. In this embodiment, the inventer gate G14 is not required. The gate electrode of the transistor TR12 is connected to that ground GND, instead of the power supply line Virtual $V_{DD}$.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A logic circuit comprising:
   a first logic gate having at least one first MOS transistor and interposed in a signal path determining an operating speed of the logic circuit, said first MOS transistor having a threshold voltage lower than a predetermined voltage and operating at a high speed, said first logic gate being constructed such that only the at least one first MOS transistor determines the operating speed of said first logic gate; and
   one or plural remaining logic gates other than said first logic gate, each of said remaining logic gates having at least one of a second MOS transistor and a third MOS transistor, having a margin for operating speed, said second MOS transistor having a medium threshold voltage equal to or greater than said predetermined voltage, and said third MOS transistor having a high threshold voltage greater than the threshold voltage of said second MOS transistor, said remaining logic gates containing no transistors of the first MOS transistor type.

2. The logic circuit as claimed in claim 1, further comprising a fourth MOS transistor having a high threshold voltage and interposed between a main power supply line and a terminal of at least one of said first and second MOS transistors.

3. The logic circuit as claimed in claim 2, wherein said at least one first MOS transistor in said first logic gate includes a fifth MOS transistor constituting a transfer gate interposed in said signal path, and a sixth MOS transistor for controlling said fifth MOS transistor, and wherein said one or plural remaining logic gates include a second logic gate for determining an output of said fifth MOS transistor, and a third logic gate for controlling said sixth MOS transistor.

4. The logic circuit as claimed in claim 3, wherein said sixth MOS transistor has its drain terminal connected to a gate terminal of said fifth MOS transistor, its source terminal connected to an output terminal of said third logic gate, and its gate terminal connected to one of said high potential power supply line and said main power supply line.

5. The logic circuit as claimed in claim 1, wherein said first, second and third MOS transistors have a SOI structure, and wherein at least one of said low threshold voltage first MOS transistor and said medium threshold voltage second MOS transistor is a fully depleted MOS transistor.

6. The logic circuit as claimed in claim 2, wherein said first, second and third MOS transistors have a SOI structure, and wherein at least one of said low threshold voltage first MOS transistor and said medium threshold voltage second MOS transistor is a fully depleted MOS transistor.

7. The logic circuit as claimed in claim 2, wherein said MOS transistors have a SOI structure, wherein at least one of said low threshold voltage first MOS transistor and said medium threshold voltage second MOS transistor is a fully depleted MOS transistor, and wherein said high threshold voltage third MOS transistor is a fully depleted MOS transistor.

8. The logic circuit as claimed in claim 3, wherein said fifth MOS transistor is a first first-conductivity-type-channel MOS enhancement transistor having a source connected to a signal input terminal of said transfer gate, and a drain connected to a signal output terminal of said transfer gate, wherein said sixth MOS transistor is a second first-conductivity-type-channel MOS enhancement transistor having a source connected to an output terminal of said third logic gate, a drain connected to a gate of said first first-conductivity-type-channel MOS enhancement transistor, and a gate connected to said high potential power supply or the ground, and wherein a body of said first first-conductivity-type-channel MOS enhancement transistor and a body of said second first-conductivity-type-channel MOS enhancement transistor are both made floating.

9. The logic circuit as claimed in claim 8, wherein said first first-conductivity-type-channel MOS enhancement transistor and said second first-conductivity-type-channel MOS enhancement transistor have a SOT structure.

10. The logic circuit as claimed in claim 9, wherein said first first-conductivity-type-channel MOS enhancement transistor and said second first-conductivity-type-channel MOS enhancement transistor are of fully depleted type.

11. The logic circuit as claimed in claim 4, wherein said one or plural remaining logic gates include a full adder for performing addition by receiving first and second input signals and a carry signal, said carry signal being supplied to said transfer gate, wherein said third logic gate controls determine whether or not said carry signal is output from said transfer gate in response to said first and second input signals, and wherein said second logic gate generates as an output of said transfer gate an output predetermined in accordance with said first and second input signals when said carry signal is not output from said transfer gate in response to said first and second input signals.

12. The logic circuit as claimed in claim 8, wherein said one or plural remaining logic gates include a full adder for performing addition by receiving first and second input signals and a carry signal, said carry signal being supplied to said transfer gate, wherein said third logic gate controls to determine whether or not said carry signal is output from said transfer gate in response to said first and second input signals, and wherein said second logic gate generates as an output of said transfer gate an output predetermined in accordance with said first and second input signals when said carry signal is not output from said transfer gate in response to said first and second input signals.

13. The logic circuit as claimed in claim 9, wherein said one or plural remaining logic gates include a full adder for performing addition by receiving first and second input signals and a carry signal, said carry signal being supplied to said transfer gate, wherein said third logic gate controls determine whether or not said carry signal is output from said transfer gate in response to said first and second input signals, and wherein said second logic gate generates as an output of said transfer gate an output predetermined in accordance with said first and second input signals when said carry signal is not output from said transfer gate in response to said first and second input signals.

14. The logic circuit as claimed in claim 10, wherein said one or plural remaining logic gates include a full adder for performing addition by receiving first and second input signals and a carry signal, said carry signal being supplied to said transfer gate, wherein said third logic gate controls determine whether or not said carry signal is output from said transfer gate in response to said first and second input signals, and wherein said second logic gate generates as an output of said transfer gate an output predetermined in accordance with said first and second input signals when said carry signal is not output from said transfer gate in response to said first and second input signals.

15. The logic circuit as claimed in claim 2, wherein said at least one first MOS transistor having a lower threshold voltage includes a first and a second first-conductivity-type-channel enhancement MOS transistors, said first first-conductivity-type-channel enhancement MOS transistor having a source connected to a signal input terminal, and a drain connected to a signal output terminal; and said second first-conductivity-type-channel enhancement MOS transistor having a source connected to a control terminal, a drain connected to a gate of said first first-conductivity-type-channel enhancement MOS transistor, and a gate connected to a high potential power supply or the ground, wherein said first and second first-conductivity-type-channel enhancement MOS transistors, whose bodies are made floating, constitute a switching circuit as a transfer gate.

16. A logic circuit comprising:
 a first logic gate having at least one first MOS transistor and interposed in a signal path determining an operating speed of the logic circuit, said first MOS transistor having a threshold voltage lower than a predetermined voltage and operating at a high speed;
 one or plural remaining logic gates other than said first logic gate, each of said remaining logic gates comprising at least one of both a second MOS transistor or a third MOS transistor, having a margin for operating speed, said second MOS transistor having a medium threshold voltage equal to or greater than said predetermined voltage, and said third MOS transistor having a high threshold voltage greater than said medium threshold voltage; and
 a fourth MOS transistor having a high threshold voltage interposed between a main power supply line and a terminal of at least one of said first and second MOS transistors;
 wherein said at least one first MOS transistor in said first logic gate includes a fifth MOS transistor constituting a transfer gate interposed in said signal path, and a sixth MOS transistor for controlling said fifth MOS transistor, and wherein said one or plural remaining logic gates include a second logic gate for determining an output of said fifth MOS transistor and a third logic gate for controlling said sixth MOS transistor.

17. A method of fabricating logic circuits, consisting of multiple logic gates, comprising the steps of:
 fabricating one or more first-type logic gates, to be located in a signal path that determines the operating speed of the logic circuit, such that said one or more first-type logic gates comprise at least one first-type MOS transistor having a threshold voltage lower than a predetermined value and operating at a high speed, only said at least one first-type MOS transistor determining the operating speed of said one or more first-type logic gates; and fabricating one or more additional logic gates, not located in said signal path that determines the operating speed of the logic circuit, such that said one or more additional logic gates comprise second-type MOS transistors and third-type MOS transistors, and not first-type MOS transistors, said second-type MOS transistors having a threshold voltage that is greater than said predetermined value, and thus operating at a lower speed than said first-type MOS transistor, and said third-type MOS transistors having a threshold voltage that is greater than the threshold voltage of said second-type MOS transistors, and thus operating at a lower speed than said second-type MOS transistor.

* * * * *